(12) United States Patent
Ito et al.

(10) Patent No.: US 11,152,550 B2
(45) Date of Patent: Oct. 19, 2021

(54) LIGHT-EMITTING DEVICE

(71) Applicant: TS TECH CO., LTD., Saitama (JP)

(72) Inventors: Takayoshi Ito, Tochigi (JP); Kazumasa Narita, Tochigi (JP)

(73) Assignee: TS TECH CO., LTD., Saitama (JP)

( * ) Notice: Subject to any disclaimer, the term of this patent is extended or adjusted under 35 U.S.C. 154(b) by 122 days.

(21) Appl. No.: 16/491,911

(22) PCT Filed: Sep. 28, 2017

(86) PCT No.: PCT/JP2017/035154
§ 371 (c)(1),
(2) Date: Sep. 6, 2019

(87) PCT Pub. No.: WO2018/163483
PCT Pub. Date: Sep. 13, 2018

(65) Prior Publication Data
US 2021/0135071 A1 May 6, 2021

(30) Foreign Application Priority Data

Mar. 9, 2017 (JP) .............................. JP2017-045166
Mar. 9, 2017 (JP) .............................. JP2017-045167
Mar. 9, 2017 (JP) .............................. JP2017-045168

(51) Int. Cl.
*H01L 33/58* (2010.01)
*H01L 33/62* (2010.01)
*H01L 33/64* (2010.01)

(52) U.S. Cl.
CPC .............. *H01L 33/58* (2013.01); *H01L 33/62* (2013.01); *H01L 33/644* (2013.01)

(58) Field of Classification Search
CPC combination set(s) only.
See application file for complete search history.

(56) References Cited

U.S. PATENT DOCUMENTS 6,152,590 A 11/2000 Furst et al.
2003/0133302 A1 7/2003 Kamiya et al.
(Continued)

FOREIGN PATENT DOCUMENTS

JP S59-148375 A 8/1984
JP H07-263723 A 10/1995
(Continued)

OTHER PUBLICATIONS

International Search Report dated Dec. 12, 2017 for the corresponding PCT Application No. PCT/JP2017/035154, with partial English translation.

*Primary Examiner* — Ratisha Mehta
(74) *Attorney, Agent, or Firm* — Michael Best & Friedrich LLP

(57) ABSTRACT

An object of the present invention is to suppress the occurrence of a short circuit in a light-emitting device. A light-emitting device 1 includes a conductive member 11, a holding member 20 holding the conductive member 11, at least a part of the conductive member 11 being inserted in the holding member 20, a light-emitting element 30 connected to the conductive member 11, and a cover member 40 covering the holding member 20. The conductive member 11 has exposed portions 16 exposed to the outside from the holding member 20. The cover member 40 covers all the exposed portions 16 and has a lens portion 41 disposed at a position facing the light-emitting element 30.

13 Claims, 36 Drawing Sheets

(56) References Cited

U.S. PATENT DOCUMENTS

| | | | |
|---|---|---|---|
| 2004/0208210 A1* | 10/2004 | Inoguchi | H01L 25/167 372/36 |
| 2012/0092852 A1* | 4/2012 | Doan | F21V 5/10 362/84 |
| 2012/0275157 A1* | 11/2012 | Hsu | F21S 4/22 362/249.06 |
| 2015/0043216 A1* | 2/2015 | Du | F21V 23/007 362/296.01 |
| 2015/0146433 A1 | 5/2015 | Suzuki | |
| 2017/0096096 A1 | 4/2017 | Suzuki | |
| 2018/0134213 A1 | 5/2018 | Boiroux et al. | |
| 2018/0290588 A1 | 10/2018 | Suzuki | |

FOREIGN PATENT DOCUMENTS

| | | |
|---|---|---|
| JP | 2003-258314 A | 9/2003 |
| JP | 2010-205787 A | 9/2010 |
| JP | 2012-089602 A | 5/2012 |
| WO | 2013/168253 A1 | 11/2013 |
| WO | 2016/166065 A1 | 10/2016 |

* cited by examiner

LIGHT-EMITTING DEVICE

CROSS-REFERENCE TO RELATED APPLICATIONS

The present application is entering the National Phase of International Application PCT/JP2017/035154, filed on Sep. 28, 2017. Further, this application claims priority from Japanese Patent Applications JP 2017-045166, filed on Mar. 9, 2017, JP 2017-045167, filed Mar. 9, 2017, and JP 2017-045168, filed Mar. 9, 2017, the entire contents of which are hereby incorporated by reference into this application.

TECHNICAL FIELD

The present invention relates to a mass-producible light-emitting device.

BACKGROUND ART

As described in PATENT LITERATURE 1, a light-emitting device in which a resin holder holding a conductive member is formed by insert molding is known in the related art. Patent Literature 1 also discloses attaching a light-emitting element, a resistance element, and the like to the conductive member by reflow processing.

CITATION LIST

Patent Literature

PATENT LITERATURE 1: JP 2010-205787 A

SUMMARY OF INVENTION

Technical Problem

In a mass production process for the light-emitting element, the conductive members for a plurality of the light-emitting devices are in a connected state and the conductive member is cut for each light-emitting device after the resin holder is insert-molded. In such a case, the conductive member is exposed to the outside of the resin holder, and then the exposed portion may lead to the occurrence of a short circuit.

The present invention has been made in view of the above problems, and an object thereof is to provide a light-emitting device capable of suppressing the occurrence of a short circuit.

Solution to Problem

The above object is achieved by the light-emitting device according to the present invention including a conductive member, a holding member holding the conductive member, at least a part of the conductive member being inserted in the holding member, a light-emitting element connected to the conductive member, and a cover member covering the holding member, in which the conductive member has exposed portions exposed outward from the holding member and the cover member covers all the exposed portions.

In the light-emitting device described above, the cover member covers all the exposed portions of the conductive member exposed from the holding member, and thus the occurrence of a short circuit can be suppressed.

In the light-emitting device described above, it is preferable that the cover member has a lens portion disposed at a position facing the light-emitting element.

In this manner, the light-emitting device can be reduced in size as compared with a case where the cover member and the lens portion are separately configured.

In the light-emitting device described above, it is preferable that the cover member has an upper surface portion where the lens portion is formed and a side surface portion where a second engagement portion is formed, the second engagement portion being engaged with a first engagement portion provided in a side portion of the holding member, and the second engagement portion is formed at a position not overlapping the lens portion in top view.

In this manner, even in a case where a manufacturing error occurs in the second engagement portion of the cover member, it is possible to reduce the effect of the error on the lens portion. As a result, variations in the accuracy of the optical system of the light-emitting device can be reduced.

In the light-emitting device described above, it is preferable that the first engagement portion is formed at a position not overlapping the exposed portion in top view.

In this manner, interference of the exposed portion with the engagement between the cover member and the holding member can be suppressed.

In the light-emitting device described above, it is preferable that an upper surface portion of the cover member and an upper surface portion of the holding member are substantially on the same plane in side view.

In this manner, the upper surface portion of the light-emitting device can be configured without a step. As a result, the design of the light-emitting device can be improved.

In the light-emitting device described above, it is preferable that the cover member is engaged with the holding member by sliding.

In this manner, it is possible to easily attach the cover member to the holding member.

In the light-emitting device described above, the conductive member is provided with a first connection portion connected to the light-emitting element and a second connection portion connected to an electric power source. The holding member is provided with a mounting portion holding the first connection portion and an accommodating portion in which the second connection portion is accommodated. The mounting portion and the accommodating portion are provided at positions not vertically overlapping each other.

In the light-emitting device described above, the mounting portion and the accommodating portion are provided at positions not vertically overlapping each other, and thus the heat of the mounting portion is unlikely to be transmitted to the accommodating portion. Accordingly, no heat is likely to be stagnant in the accommodating portion. As a result, the heat dissipation of the light-emitting device can be enhanced.

In the light-emitting device described above, it is preferable that an upper surface of the mounting portion and an upper surface of the accommodating portion are substantially on the same plane and the conductive member is bent such that the first connection portion is above the second connection portion in side view.

By the upper surfaces of the mounting portion and the accommodating portion being substantially on the same plane as described above, reflow processing for attaching the light-emitting element to the mounting portion is facilitated.

In the light-emitting device described above, it is preferable that a hole is vertically formed in a lower surface of the mounting portion and a distance between the conductive member and a lower surface of the mounting portion exceeds a distance between the conductive member and an upper surface of the mounting portion.

By increasing the distance between the mounting portion and the hole formed when a support member supporting the mounting portion when the holding member is molded is removed as described above, it is possible to suppress a liquid such as water that has infiltrated from the hole reaching the conductive member. As a result, the waterproofness of the light-emitting device can be enhanced.

In the light-emitting device described above, it is preferable that a hole is vertically formed in a lower surface of the mounting portion and the hole is blocked by a blocking member.

In this manner, it is possible to suppress the infiltration of a liquid such as water from the hole formed when the support member supporting the mounting portion when the holding member is molded is removed. As a result, the waterproofness of the light-emitting device can be enhanced.

In the light-emitting device described above, it is preferable that the mounting portion has a heat sink portion.

In this manner, the heat dissipation from the mounting portion can be improved. As a result, a rise in the temperature of the light-emitting device can be suppressed and stability enhancement can be achieved.

In the light-emitting device described above, it is preferable that the conductive member has a vertically extending portion extending in a vertical direction and a circuit portion connecting one end of the vertically extending portion and the first connection portion and the second connection portion is connected to the other end of the vertically extending portion.

In this manner, the design freedom of the light-emitting device can be enhanced.

Advantageous Effects of Invention

According to the present invention, the occurrence of a short circuit in the light-emitting device can be suppressed.

According to an aspect of the present invention, the light-emitting device can be reduced in size.

According to an aspect of the present invention, interference between the lens portion and the engagement portion is suppressed.

According to an aspect of the present invention, interference of the exposed portion with the engagement between the cover member and the holding member can be suppressed.

According to an aspect of the present invention, the upper surface portion of the light-emitting device can be configured without a step.

According to an aspect of the present invention, it is possible to easily attach the cover member to the holding member.

According to an aspect of the present invention, the heat dissipation of the light-emitting device can be enhanced.

According to an aspect of the present invention, reflow processing for attaching the light-emitting element to the mounting portion is facilitated.

According to an aspect of the present invention, the waterproofness of the light-emitting device can be enhanced.

According to an aspect of the present invention, the heat dissipation in the mounting portion can be improved.

According to an aspect of the present invention, the design freedom of the light-emitting device can be enhanced.

DESCRIPTION OF EMBODIMENTS

1

Hereinafter, a light-emitting device according to embodiments of the present invention (hereinafter, the present embodiment) will be described with reference to FIGS. 1 to 15. The light-emitting device is mounted on the interior of a vehicle or the like.

Incidentally, the embodiments described below are merely examples for facilitating the understanding of the present invention and do not limit the present invention. In other words, members described below can be modified or improved in shape, dimension, disposition, and so on without departing from the scope of the present invention and it is a matter of course that the present invention includes equivalents of the present invention.

Hereinafter, the surface of the light-emitting device to which a light-emitting element is attached will be referred to as an upper surface and a surface connected to the upper surface will be referred to as a side surface.

First, a light-emitting device 1 according to a first embodiment will be described based on FIGS. 1 to 10. Next, a light-emitting device 1A according to a second embodiment will be described based on FIGS. 11 to 14. Further, a light-emitting device 1B according to a third embodiment will be described based on FIG. 15.

First Embodiment

A manufacturing process for the light-emitting device 1 and the configuration of the light-emitting device 1 will be described with reference to FIGS. 1 to 10.

First Process

Figure 1:
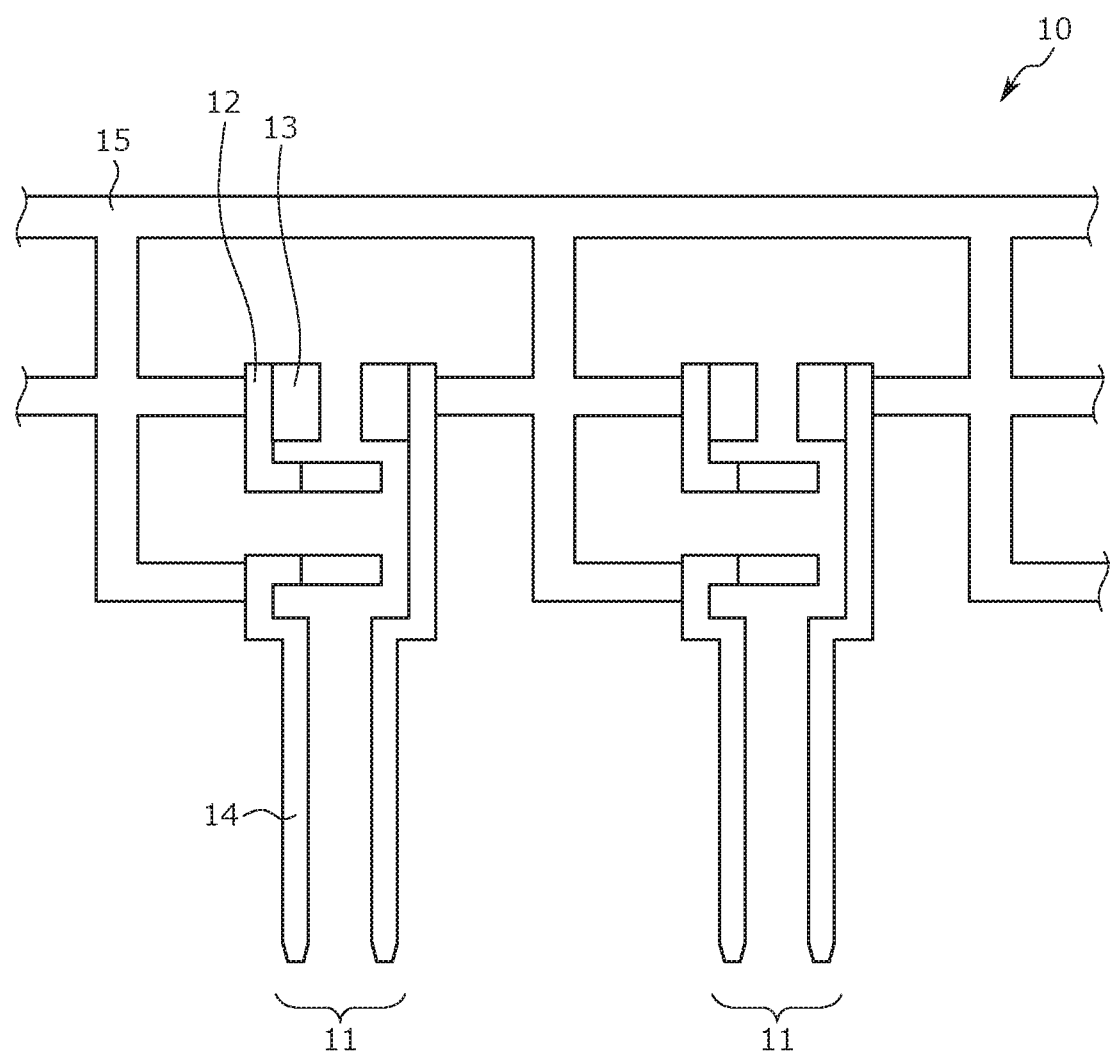
FIG. 1 is a diagram illustrating an example of a conductive member lot manufactured in a mass production process.

A conductive member lot 10 made of a conductive material is formed first as illustrated in FIG. 1. For example, the conductive member lot 10 may be formed by molding or may be formed by punching and bending.

Incidentally, a metal such as copper, steel, and aluminum may be used as the conductive material.

As illustrated in FIG. 1, a plurality of conductive members 11 are connected to the conductive member lot 10 by a connecting portion 15. The conductive member 11 is used in one light-emitting device 1.

Each of the conductive members 11 is provided with an electrode pad 13, a connection terminal 14, and a circuit portion 12 connecting the electrode pad 13 and the connection terminal 14.

A light-emitting element such as an LED and a device such as a resistance element are attached to the electrode pad 13. The connection terminal 14 is a terminal connected to an external power supply circuit or control circuit.

Second Process

Figure 2:
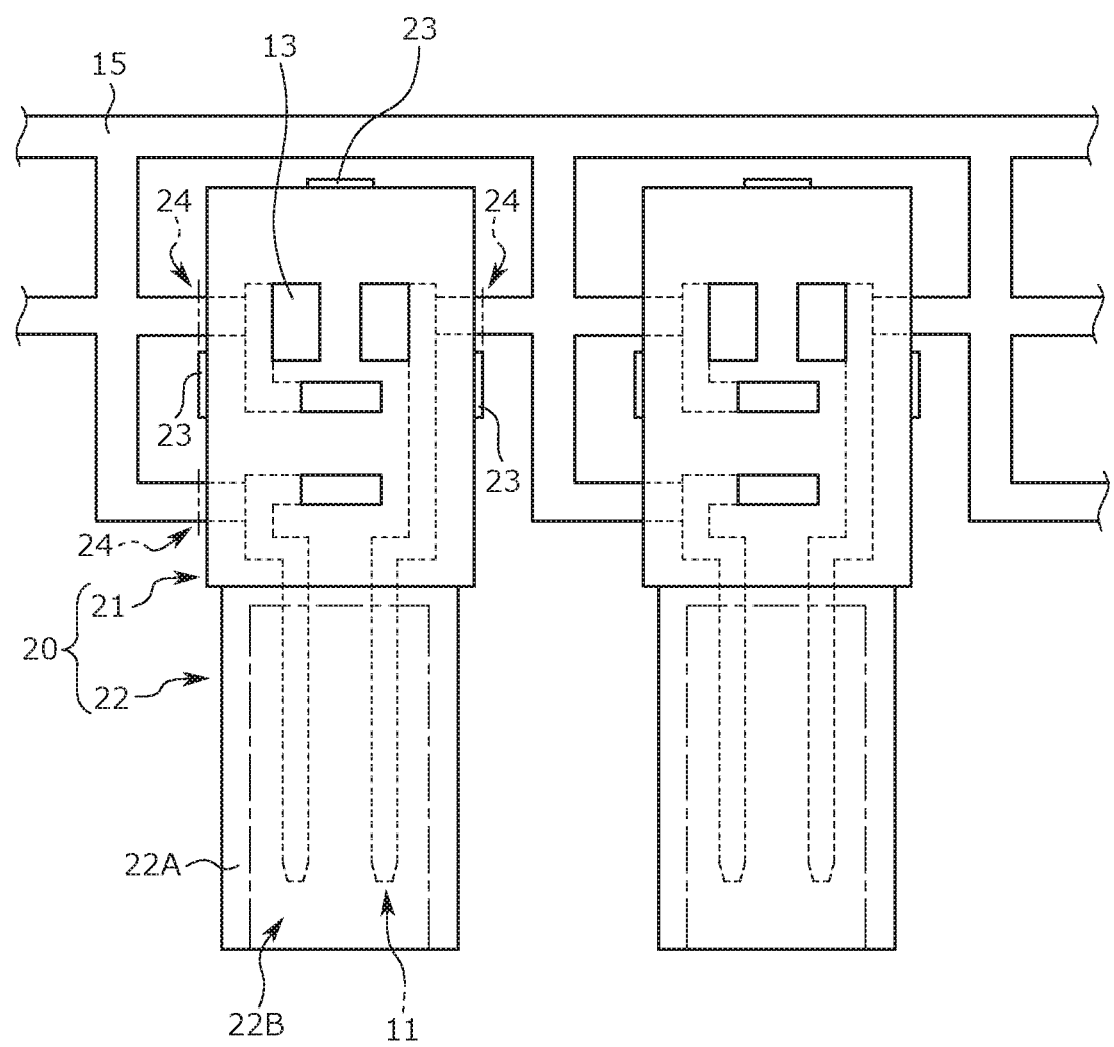
FIG. 2 is a diagram illustrating a state where a holding member is insert-molded in the conductive member lot.

Next, as illustrated in FIG. 2, holding members 20 are formed by injection molding being performed on a resin material (that is, by insert molding) in a state where the conductive member 11 is inserted. A liquid crystal polymer, polybutylene terephthalate (PBT), polyphenylene sulfide (PPS), and so on may be used as the resin material.

Incidentally, the holding members 20 are molded one by one with respect to each conductive member 11. Details of the configuration of the holding members 20 will be described later.

Third Process

After the holding member 20 is molded, the connecting portion 15 of the conductive member lot 10 is cut at a cutting point 24 in the vicinity of the holding member 20. A substrate portion 2 illustrated in FIGS. 3 and 4 is manufactured as a result.

Figure 3:
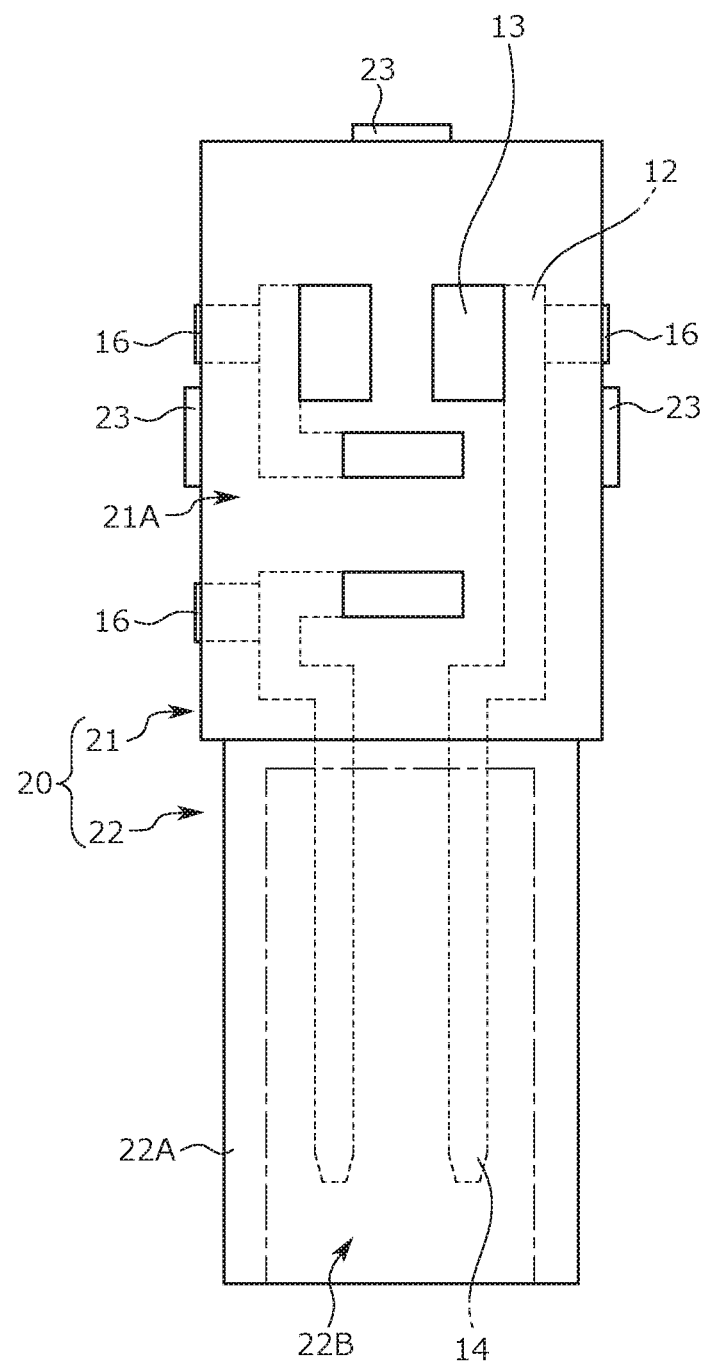
FIG. 3 is a top view of a substrate portion of a light-emitting device according to a first embodiment.
Figure 4:
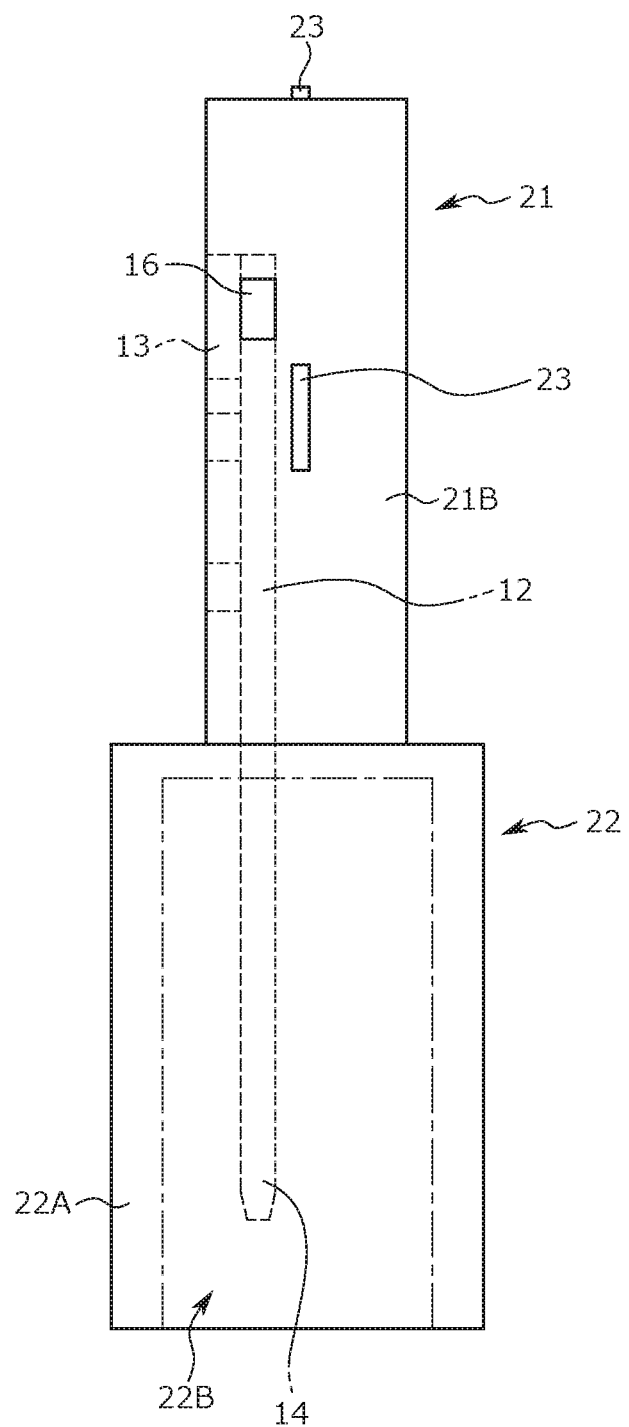
FIG. 4 is a side view of the substrate portion of the light-emitting device according to the first embodiment.

As illustrated in FIGS. 3 and 4, the conductive member 11 and the holding member 20 constitute the substrate portion 2. The configuration of the conductive member 11 is as described above, and thus the configuration of the holding member 20 will be described below.

As illustrated in FIGS. 3 and 4, a mounting portion 21 and an accommodating portion 22 constitute the holding member 20.

The mounting portion 21 is apart formed around the circuit portion 12 and the electrode pad 13, and the accommodating portion 22 is a part formed around the connection terminal 14.

As illustrated in FIG. 4, the upper surface of the accommodating portion 22 is higher than the upper surface of the mounting portion 21. In addition, regarding the conductive member 11, the circuit portion 12 and the connection terminal 14 are on the same plane in side view.

An opening portion is formed at the part of the mounting portion 21 that faces the electrode pad 13 on the upper surface, and the electrode pad 13 is exposed from the opening portion.

The main part of the circuit portion 12 is embedded in the mounting portion 21.

As illustrated in FIGS. 3 and 4, claw portions 23 are formed on the side surfaces of the mounting portion 21.

Incidentally, in the first embodiment, the claw portion 23 is formed on each of the three side surfaces of the mounting portion 21 that are not connected to the accommodating portion 22. The claw portion 23 is an engagement portion projecting to the outside.

On the side surface of the mounting portion 21, an exposed portion 16 of the conductive member 11 is exposed to the outside of the holding member 20.

Here, the exposed portion 16 and the claw portion 23 are formed at positions not overlapping each other in top view.

As illustrated in FIGS. 3 and 4, the accommodating portion 22 has a hollow shape and the connection terminal 14 is accommodated in the accommodating portion 22.

Fourth Process

Next, solder paste is applied to the substrate portion 2 in a state where a point other than the electrode pad 13 on which an electronic element such as a light-emitting element 30 and a resistance element 35 is mounted is masked.

Fifth Process

Next, an electronic element such as the light-emitting element 30 and the resistance element 35 is disposed on the electrode pad 13 and heating is performed in a reflow furnace.

Figure 5:
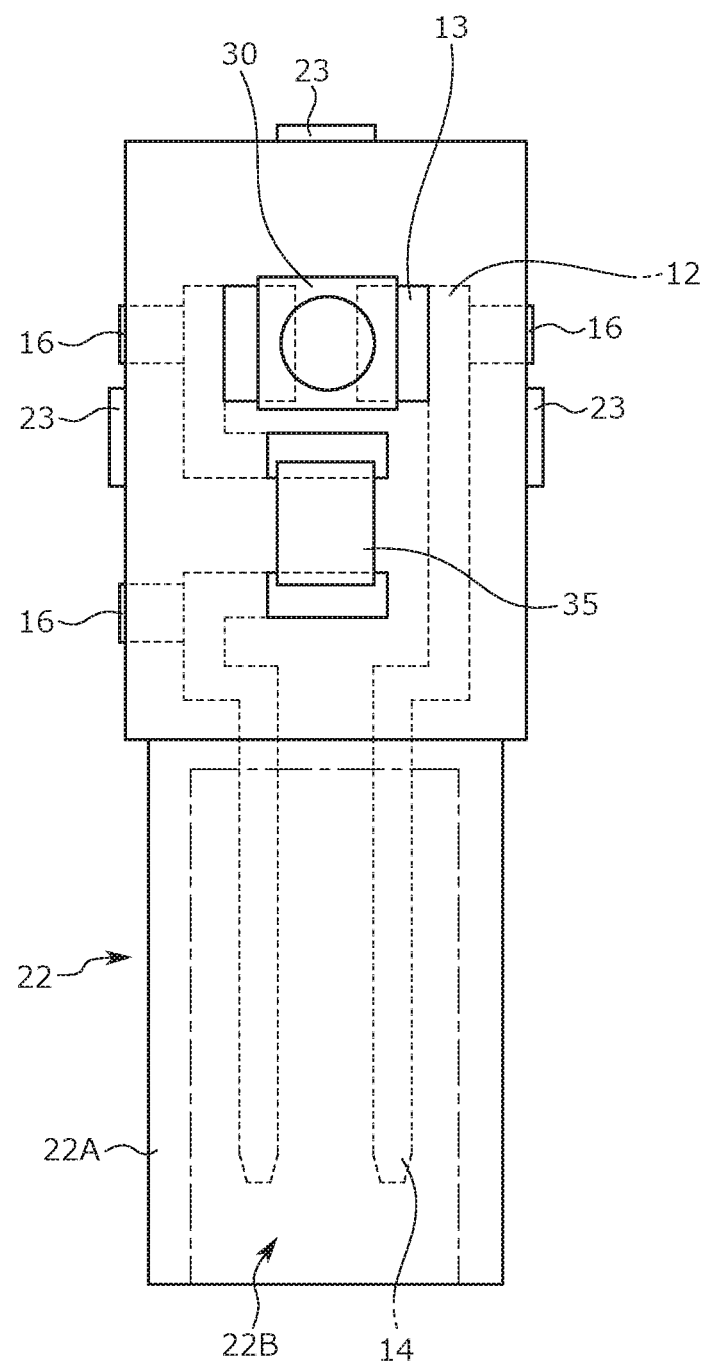
FIG. 5 is a top view of a main body portion of the light-emitting device according to the first embodiment.
Figure 6:
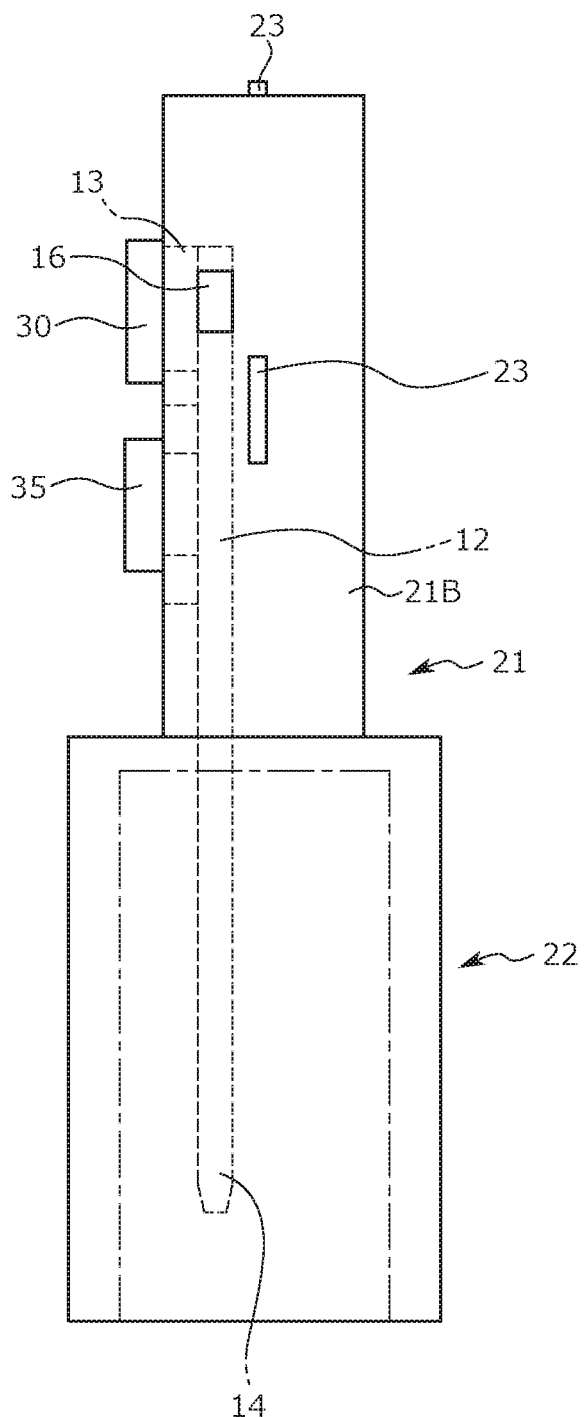
FIG. 6 is a side view of the main body portion of the light-emitting device according to the first embodiment.

As a result, a main body portion 3 in which an electronic element such as the light-emitting element 30 and the resistance element 35 is mounted on the substrate portion 2 is manufactured as illustrated in FIGS. 5 and 6.

Sixth Process

Next, a cover member 40 is attached to the main body portion 3. Incidentally, the light-emitting device 1 is the main body portion 3 to which the cover member 40 is attached.

Here, the configuration of the cover member 40 will be described with reference to FIGS. 7 and 8. The cover member 40 is a transparent member formed of plastic, acryl, glass, or the like.

Incidentally, the entire cover member 40 does not have to be constituted by a transparent member and only a lens portion 41 (described later) may be constituted by a transparent member.

Figure 7:
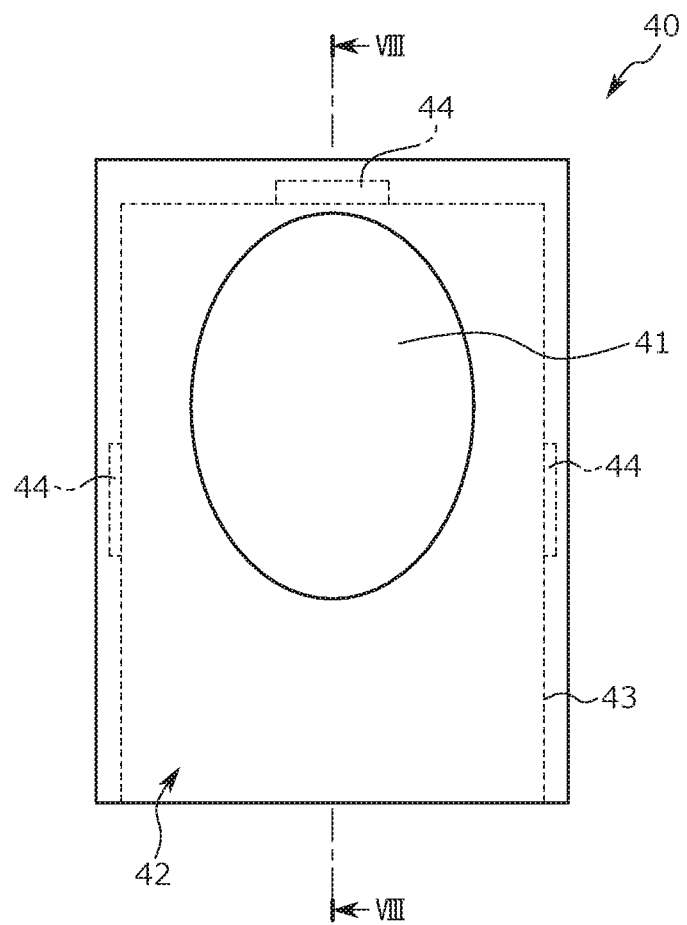
FIG. 7 is a top view of a cover member according to the first embodiment.
Figure 8:
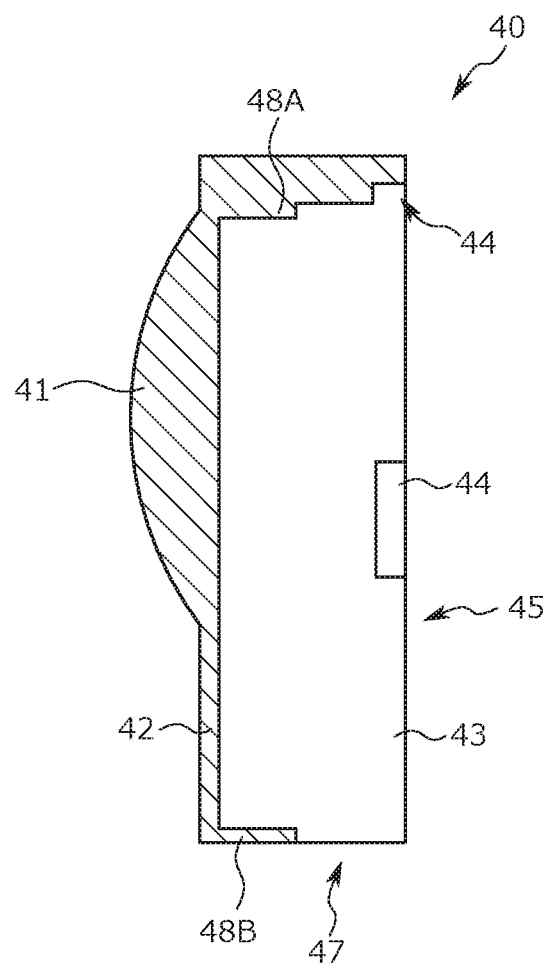
FIG. 8 is a cross-sectional view of the cover member taken along line VIII-VIII of FIG. 7.

As illustrated in FIGS. 7 and 8, the cover member 40 is provided with an upper surface portion 42 where the lens portion 41 is formed and a side surface portion 43 having an inner surface where a recess 44 is formed.

The lens portion 41 may be formed integrally with the upper surface portion 42 or may be configured by a separate lens being fitted into a through hole formed in the upper surface portion 42.

A second abutting portion 48B and a first abutting portion 48A protruding downward are formed on the back surface of the upper surface portion 42. The first abutting portion 48A and the second abutting portion 48B are formed at positions where the lens portion 41 is sandwiched. The first abutting portion 48A and the second abutting portion 48B are parts abutting against the upper surface of the mounting portion 21 when the cover member 40 is attached to the main body portion 3.

The lower surface side of the cover member 40 that faces the upper surface portion 42 is open, and this opening part is a first opening portion 45.

A part of the side surface of the cover member 40 (lower side in the drawing) is also open, and this opening part is a second opening portion 47.

In the first embodiment, the cover member 40 is pushed into the main body portion 3 in a state where the first opening portion 45 of the cover member 40 is aligned with the upper surface of the mounting portion 21 of the main body portion 3 and the second opening portion 47 of the cover member 40 is directed to the accommodating portion 22 side of the main body portion 3. As a result, the claw portion 23 (an example of a first engagement portion) of the main body portion 3 fits into the recess 44 (an example of a second engagement portion) of the cover member 40 and the cover member 40 is fixed to the main body portion 3. At this time, rattling of the cover member 40 can be suppressed by each of the first abutting portion 48A and the second abutting portion 48B of the cover member 40 abutting against the upper surface of the mounting portion 21.

Figure 9:
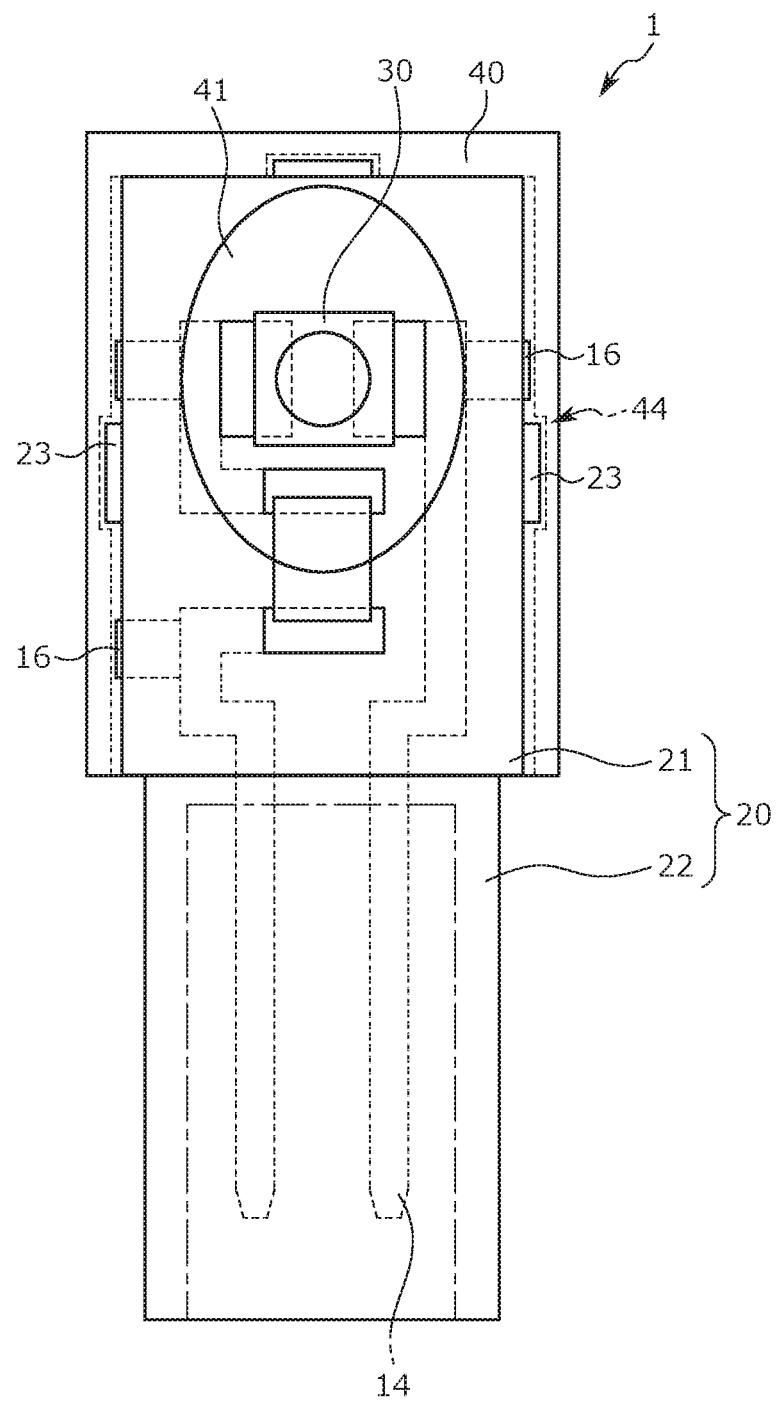
FIG. 9 is a top view of the light-emitting device according to the first embodiment.
Figure 10:
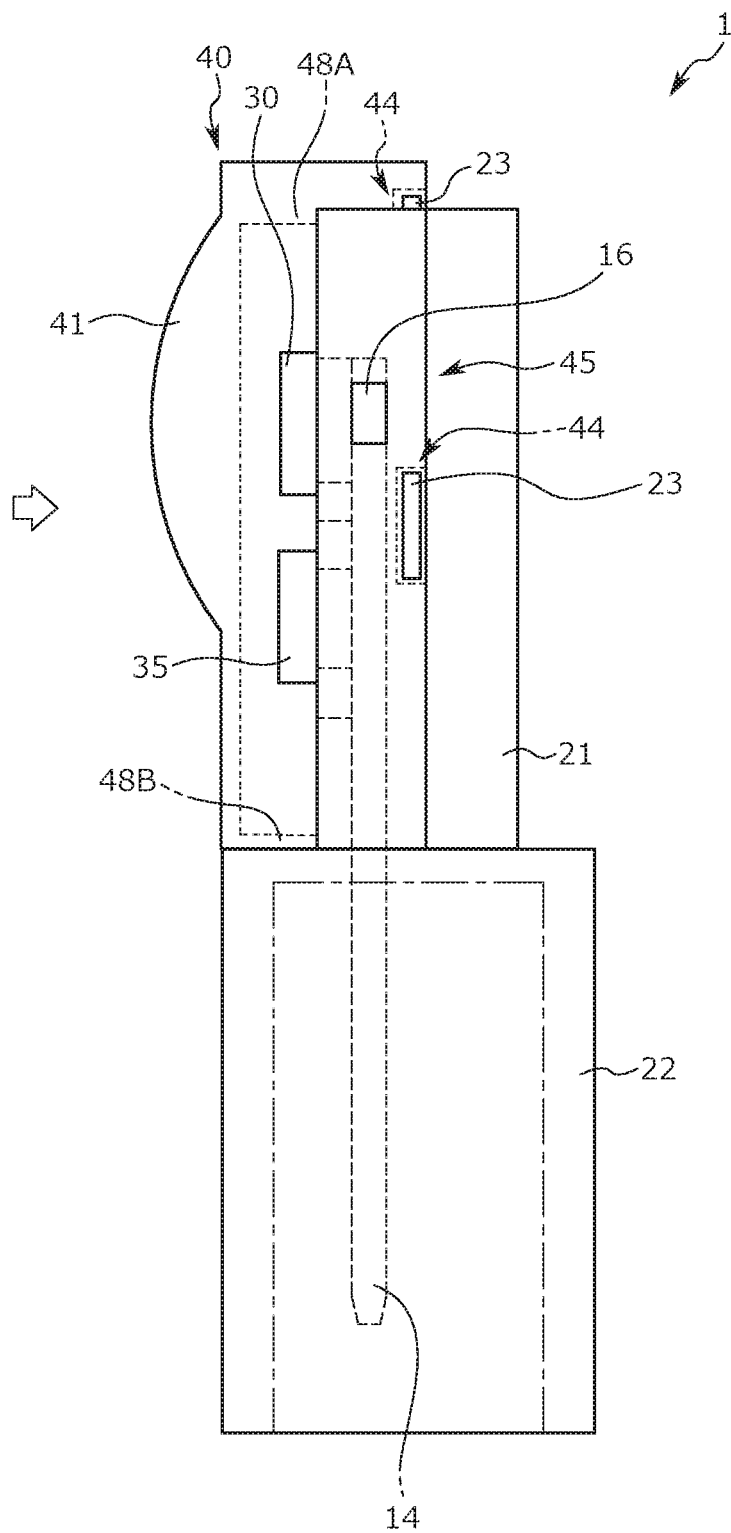
FIG. 10 is a side view of the light-emitting device according to the first embodiment.

The light-emitting device 1 illustrated in FIGS. 9 and 10 is completed through the above processes.

As described above, in the mass production process for the light-emitting device 1, a part of the conductive member 11 is exposed as the exposed portion 16 from the side portion of the holding member 20.

However, as illustrated in FIGS. 9 and 10, in the light-emitting device 1, the side surface portion 43 of the cover member 40 covers all the exposed portions 16 of the side portion of the mounting portion 21 of the main body portion 3. Accordingly, the occurrence of a short circuit can be suppressed with the light-emitting device 1.

As illustrated in FIGS. 9 and 10, in the light-emitting device 1, the cover member 40 has a lens portion disposed at a position facing the light-emitting element 30.

As a result, the light-emitting device 1 can be reduced in size as compared with a case where the cover member 40 and the lens portion 41 are separately configured.

As illustrated in FIGS. 9 and 10, in the light-emitting device 1, the recess 44 of the cover member 40 engaged with the claw portion 23 of the holding member 20 is formed at a position not overlapping the lens portion 41 in top view.

As a result, even in a case where a manufacturing error occurs in the recess 44 of the cover member 40, it is possible to reduce the effect of the error on the lens portion 41. As a result, variations in the accuracy of the optical system of the light-emitting device 1 can be reduced.

As illustrated in FIGS. 9 and 10, in the light-emitting device 1, the claw portion 23 is formed at a position not overlapping the exposed portions 16 in top view.

As a result, interference of the exposed portion 16 with the engagement between the cover member 40 and the holding member 20 can be suppressed.

As illustrated in FIG. 10, in the light-emitting device 1, the upper surface portion 42 of the cover member 40 and an upper surface portion 21A of the holding member 20 are substantially on the same plane in side view.

As a result, the upper surface portion of the light-emitting device 1 can be configured without a step. As a result, the design of the light-emitting device 1 can be improved.

Second Embodiment

Next, the light-emitting device 1A according to the second embodiment will be described with reference to FIGS. 11 to 14.

The light-emitting device 1A according to the second embodiment is different from the light-emitting device 1 according to the first embodiment in that a cover member 40A is engaged with a holding member 20A by sliding. The following description will focus on the difference.

Figure 11:
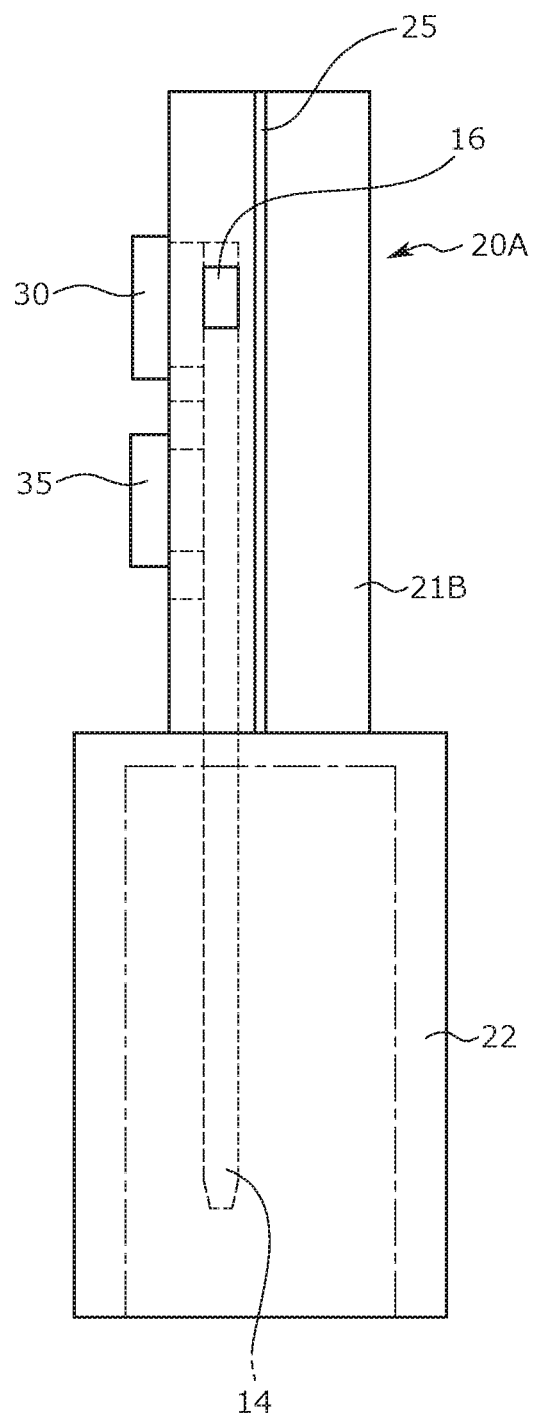
FIG. 11 is a side view of a main body portion of a light-emitting device according to a second embodiment.

FIG. 11 illustrates a side view of a main body portion 3A of the light-emitting device 1A according to the second embodiment. Incidentally, the main body portion 3A is similar in configuration to the main body portion 3 except for a side surface portion 21B of the holding member 20A, and thus descriptions thereof will be omitted. Hereinafter, the configuration of the side surface portion 21B of the holding member 20A will be described.

As illustrated in FIG. 11, in the second embodiment, a slide groove 25 along the direction of extension of the circuit portion 12 is formed in the side surface portion 21B of the holding member 20A.

The slide groove 25 is formed so as to extend from one end to the other end of the side surface portion 21B and is closer to the lower surface side than the exposed portion 16.

Incidentally, the slide grooves 25 are respectively formed in the side surface portion 21B of the holding member 20A where the exposed portion 16 is exposed.

Figure 12:
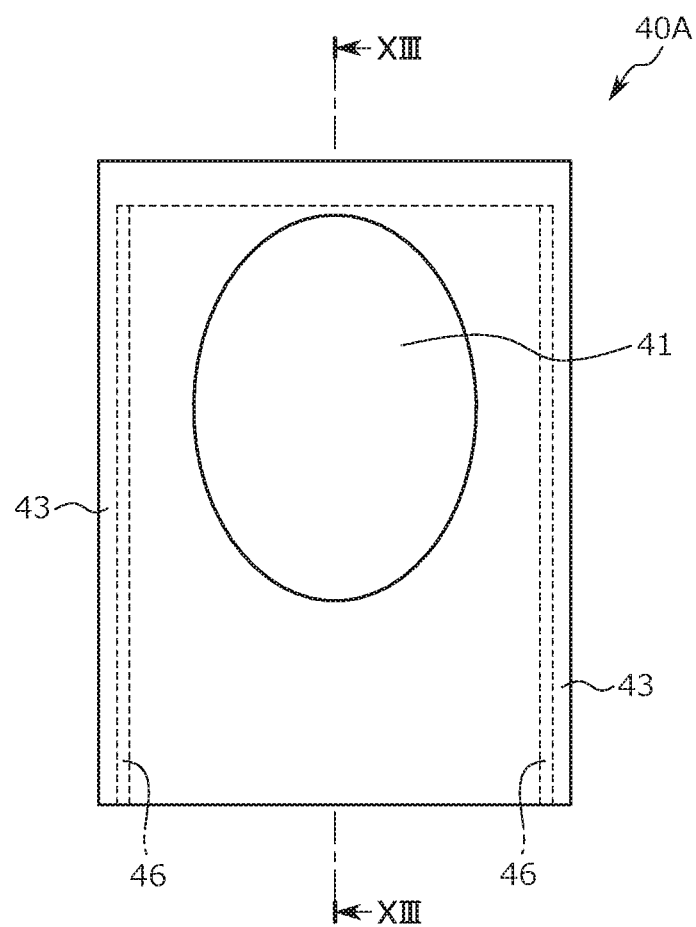
FIG. 12 is a top view of a cover member according to the second embodiment.

FIG. 12 illustrates a top view of the cover member 40A of the light-emitting device 1A according to the second embodiment.

Figure 13:
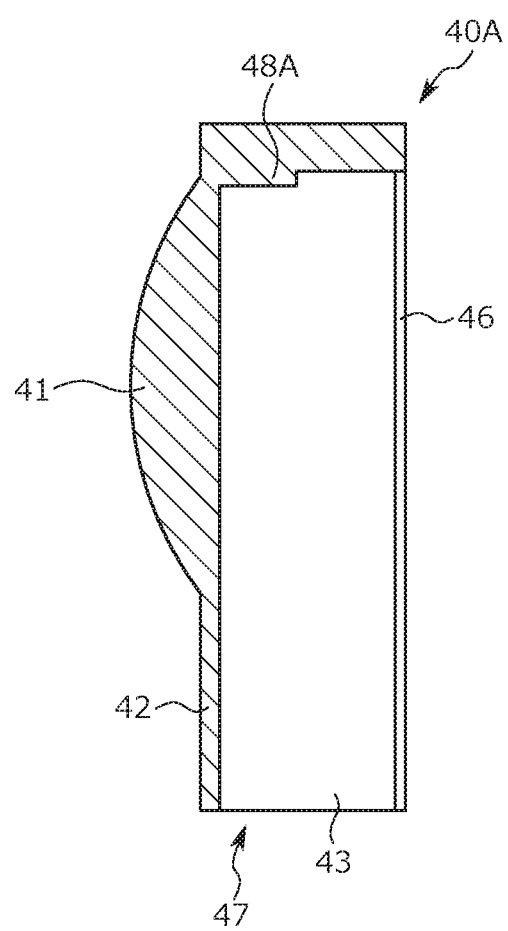
FIG. 13 is a cross-sectional view of the cover member taken along line XIII-XIII of FIG. 12.

FIG. 13 is a cross-sectional view of the cover member 40A taken along line XIII-XIII.

The upper surface portion 42 of the cover member 40A is similar in configuration to the upper surface portion 42 of the cover member 40, and thus descriptions thereof will be omitted. The following description will focus on the configuration of the side surface portion 43 of the cover member 40A.

As illustrated in FIGS. 12 and 13, a projecting portion 46 engaged with the slide groove 25 is formed on the inner surface of the side surface portion 43 of the cover member 40A.

Here, the projecting portion 46 is a linear protruding portion protruding from the inner surface of the side surface portion 43.

In the second embodiment, the second opening portion 47 of the cover member 40A is directed to the upper end portion of the main body portion 3A. Then, the cover member 40A is slid to the main body portion 3A side such that the projecting portion 46 of the cover member 40A enters the slide groove 25 of the main body portion 3A. As a result, the cover member 40A is attached to the main body portion 3A as illustrated in FIG. 14.

Figure 14:
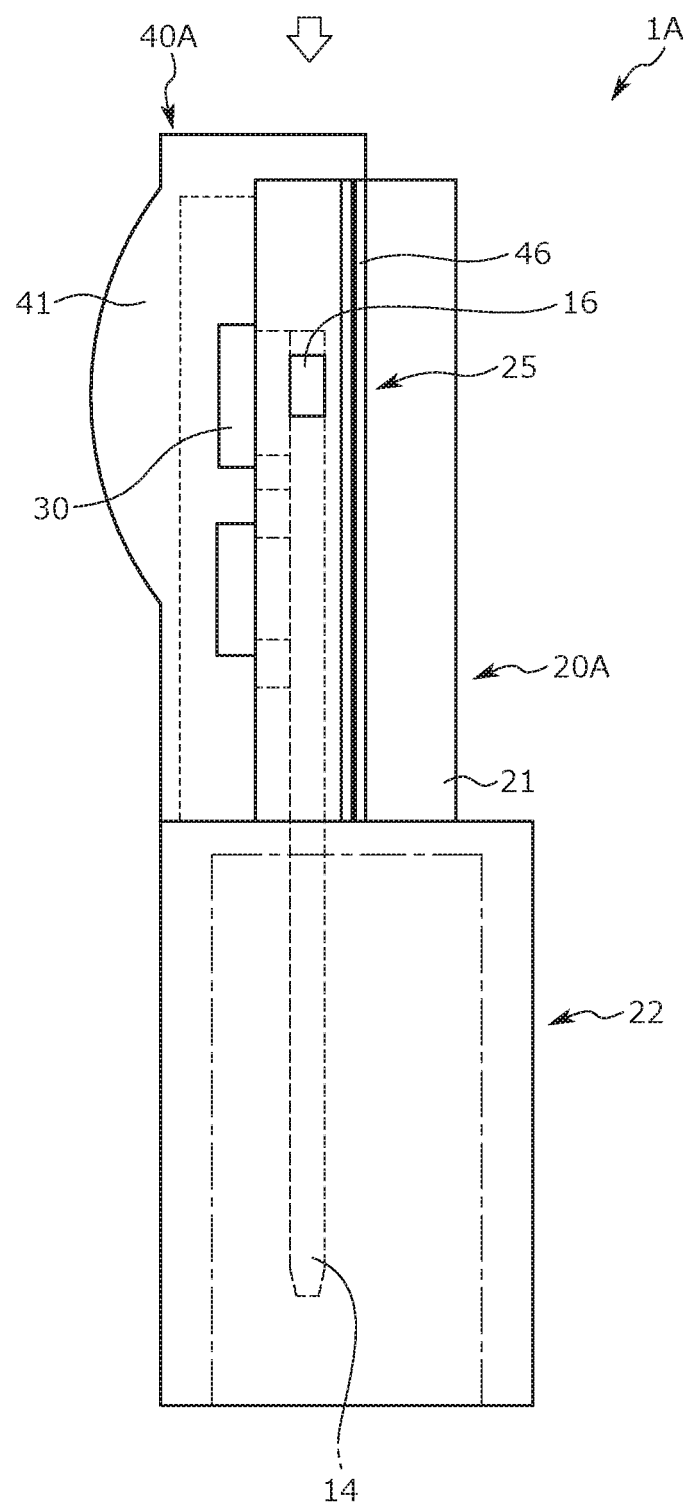
FIG. 14 is a side view of the light-emitting device according to the second embodiment.

As illustrated in FIG. 14, in the light-emitting device 1A, the side surface portion 43 of the cover member 40A covers all the exposed portions 16 of the side portion of the mounting portion 21 of the main body portion 3A. As a result, the occurrence of a short circuit can be suppressed with the light-emitting device 1A.

In the light-emitting device 1A according to the second embodiment described above, the cover member 40A is engaged with the holding member 20A by sliding, and thus it is possible to easily attach the cover member 40A to the holding member 20A.

Third Embodiment

Figure 15:
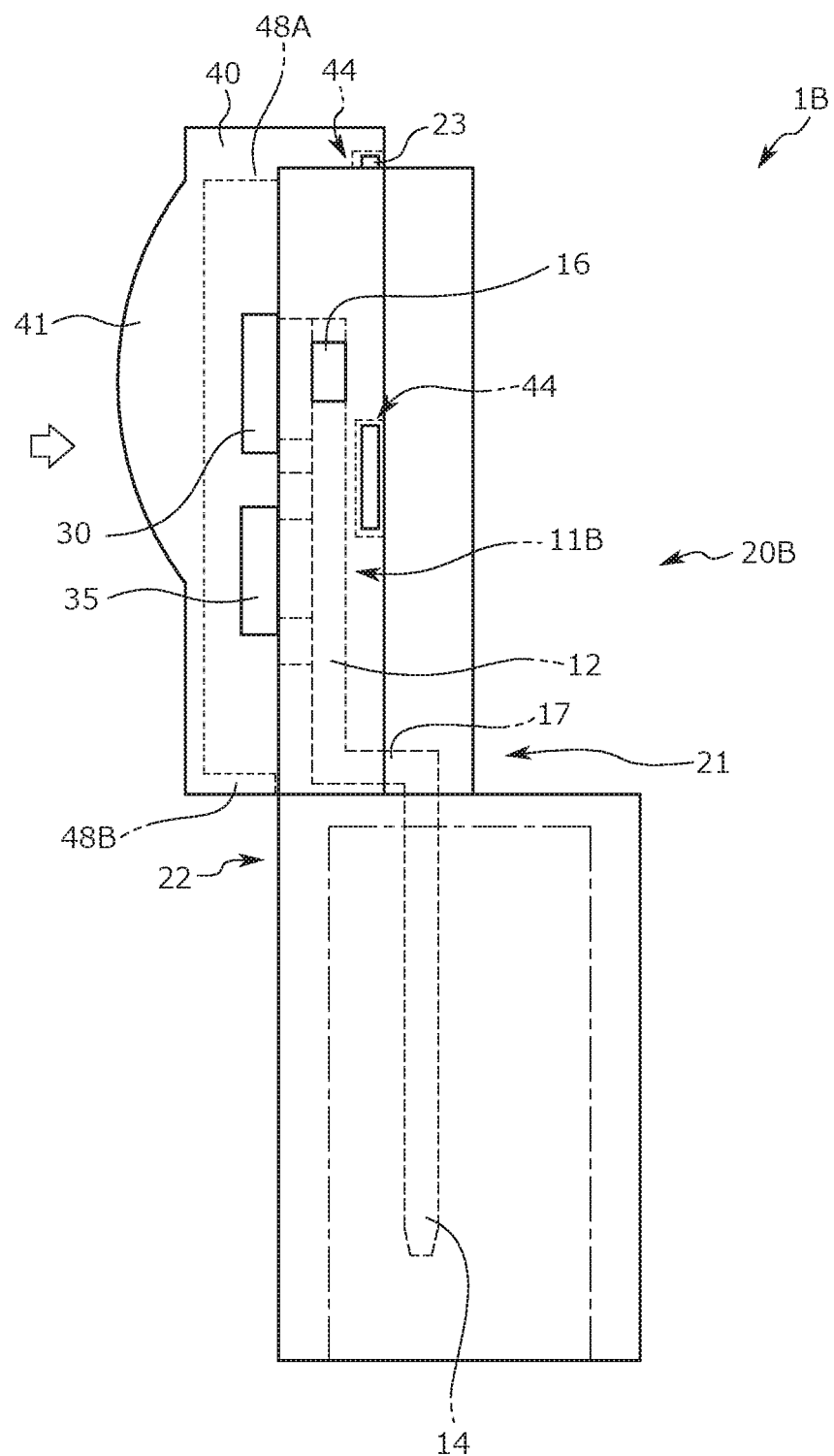
FIG. 15 is a side view of a light-emitting device according to a third embodiment.

Next, the light-emitting device 1B according to the third embodiment will be described with reference to FIG. 15.

The light-emitting device 1B according to the third embodiment is different from the light-emitting device 1 according to the first embodiment mainly in the configurations of a holding member 20B and a conductive member 11B, and the light-emitting device 1B and the light-emitting device 1 have the other points in common. The above differences will be described below.

First, the holding member 20B of the light-emitting device 1B is different from the holding member 20 of the light-emitting device 1 in that the upper surface of the mounting portion 21 and the upper surface of the accommodating portion 22 are configured at the same height. By the upper surface of the holding member 20B being substantially on the same plane as described above, reflow processing for attaching an electronic element such as the light-emitting element 30 to the mounting portion 21 is facilitated.

Next, the conductive member 11B of the light-emitting device 1B is different from the conductive member 11 of the light-emitting device 1 in that the circuit portion 12 of the conductive member 11B is disposed above the connection terminal 14 and both are connected via a vertically extending portion 17. In other words, the conductive member 11B is different from the conductive member 11 by having a vertically bent portion.

As described above, the conductive member 11B has the vertically extending portion 17 and the circuit portion 12 connecting one end of the vertically extending portion 17 and the electrode pad 13 and the connection terminal 14 is configured to be connected to the other end of the vertically extending portion 17. As a result, the design freedom of the light-emitting device 1B can be enhanced.

Here, the connection angle between the vertically extending portion 17 and the circuit portion 12 and the connection angle between the vertically extending portion 17 and the connection terminal 14 may be right angles or non-right angles.

The present invention is not limited to the above embodiments. For example, the light-emitting device 1 may be provided with a plurality of the light-emitting elements 30. In addition, the light-emitting element 30 is not limited to an LED and a fluorescent light, a semiconductor laser, and so on may be used as the light-emitting element 30.

In the above embodiment, the holding member 20 may have a hole formed when a support member supporting the conductive member 11 when the holding member 20 is molded is removed. In this case, it is possible to suppress a liquid such as water that has infiltrated from the hole reaching the conductive member 11 by increasing the distance between the conductive member 11 and the lower surface of the holding member 20. As a result, the waterproofness of the light-emitting device 1 can be enhanced. This point is similarly applicable to the light-emitting device 1A and the light-emitting device 1B.

In the above embodiment, the heat dissipation from the mounting portion 21 may be improved by the mounting portion 21 being provided with a heat sink. In such a case, a rise in the temperature of the light-emitting device 1 can be suppressed and stability enhancement can be achieved. This point is similarly applicable to the light-emitting device 1A and the light-emitting device 1B.

2

Next, another aspect of the present invention will be described.

In the light-emitting device described in JP 2010-205787 A, a light-emitting element and a connection terminal are disposed at vertically overlapping positions. Accordingly, the heat from the light-emitting element is likely to be stagnant in the space in which the connection terminal is accommodated and problems arise in terms of heat dissipation.

The present invention has been made in view of the above problems, and an object of the present invention is to provide a light-emitting device excellent in heat dissipation.

The above problems are solved by means of the light-emitting device according to the present invention including a conductive member, a holding member holding the conductive member, at least a part of the conductive member being inserted in the holding member, and a light-emitting element connected to the conductive member. The conductive member is provided with a first connection portion connected to the light-emitting element and a second connection portion connected to an electric power source. The holding member is provided with a mounting portion holding the first connection portion and an accommodating portion in which the second connection portion is accommodated. The mounting portion and the accommodating portion are provided at positions not vertically overlapping each other.

In the light-emitting device described above, the mounting portion and the accommodating portion are provided at positions not vertically overlapping each other, and thus the heat of the mounting portion is unlikely to be transmitted to the accommodating portion. Accordingly, no heat is likely to be stagnant in the accommodating portion. As a result, the heat dissipation of the light-emitting device can be enhanced.

In the light-emitting device described above, it is preferable that the upper surface of the mounting portion and the upper surface of the accommodating portion are substantially on the same plane and the conductive member is bent such that the first connection portion is above the second connection portion in side view.

By the upper surfaces of the mounting portion and the accommodating portion being substantially on the same plane as described above, reflow processing for attaching the light-emitting element to the mounting portion is facilitated.

In the light-emitting device described above, it is preferable that a hole is vertically formed in the lower surface of the mounting portion and the distance between the conductive member and the lower surface of the mounting portion exceeds the distance between the conductive member and the upper surface of the mounting portion.

By increasing the distance between the mounting portion and the hole formed when a support member supporting the mounting portion when the holding member is molded is removed as described above, it is possible to suppress a liquid such as water that has infiltrated from the hole reaching the conductive member. As a result, the waterproofness of the light-emitting device can be enhanced.

In the light-emitting device described above, it is preferable that a hole is vertically formed in the lower surface of the mounting portion and the hole is blocked by a blocking member.

In this manner, it is possible to suppress the infiltration of a liquid such as water from the hole formed when the support member supporting the mounting portion when the holding member is molded is removed. As a result, the waterproofness of the light-emitting device can be enhanced.

In the light-emitting device described above, it is preferable that the mounting portion has a heat sink portion.

In this manner, the heat dissipation from the mounting portion can be improved. As a result, a rise in the temperature of the light-emitting device can be suppressed and stability enhancement can be achieved.

In the light-emitting device described above, it is preferable that the conductive member has a vertically extending portion extending in a vertical direction and a circuit portion connecting one end of the vertically extending portion and the first connection portion and the second connection portion is connected to the other end of the vertically extending portion.

In this manner, the design freedom of the light-emitting device can be enhanced.

Hereinafter, a light-emitting device according to embodiments of the present invention (hereinafter, the present embodiment) will be described with reference to FIGS. 16 to 30. The light-emitting device is mounted on the interior of a vehicle or the like.

Incidentally, the embodiments described below are merely examples for facilitating the understanding of the present invention and do not limit the present invention. In other words, members described below can be modified or improved in shape, dimension, disposition, and so on without departing from the scope of the present invention and it is a matter of course that the present invention includes equivalents of the present invention.

Hereinafter, the surface of the light-emitting device to which a light-emitting element is attached will be referred to as an upper surface, a surface connected to the upper surface will be referred to as a side surface, and a surface facing the upper surface will be referred to as a lower surface. The direction from the upper surface to the lower surface will be referred to as a downward direction and the direction from the lower surface to the upper surface will be referred to as an upward direction.

Fourth Embodiment

A manufacturing process for the light-emitting device 1 according to a fourth embodiment and the configuration of the light-emitting device 1 will be described with reference to FIGS. 16 to 28.

First Process

Figure 16:
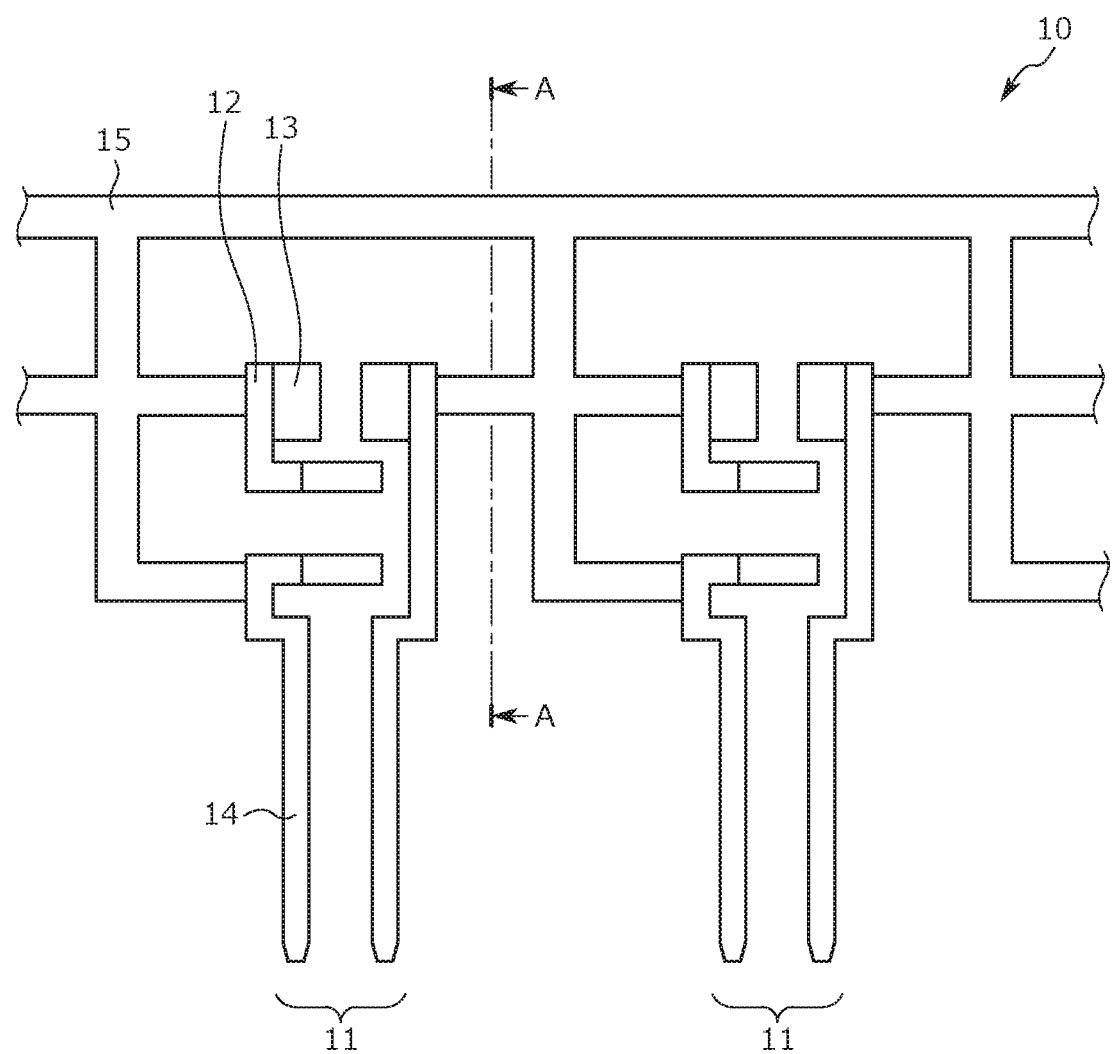
FIG. 16 is a diagram illustrating an example of a conductive member lot manufactured in a mass production process.

The conductive member lot 10 made of a conductive material is formed first as illustrated in FIG. 16. For example, the conductive member lot 10 may be formed by molding or may be formed by punching and bending.

Incidentally, a metal such as copper, steel, and aluminum may be used as the conductive material.

As illustrated in FIG. 16, a plurality of the conductive members 11 are connected to the conductive member lot 10 by the connecting portion 15. The conductive member 11 is used in one light-emitting device 1.

Figure 17:
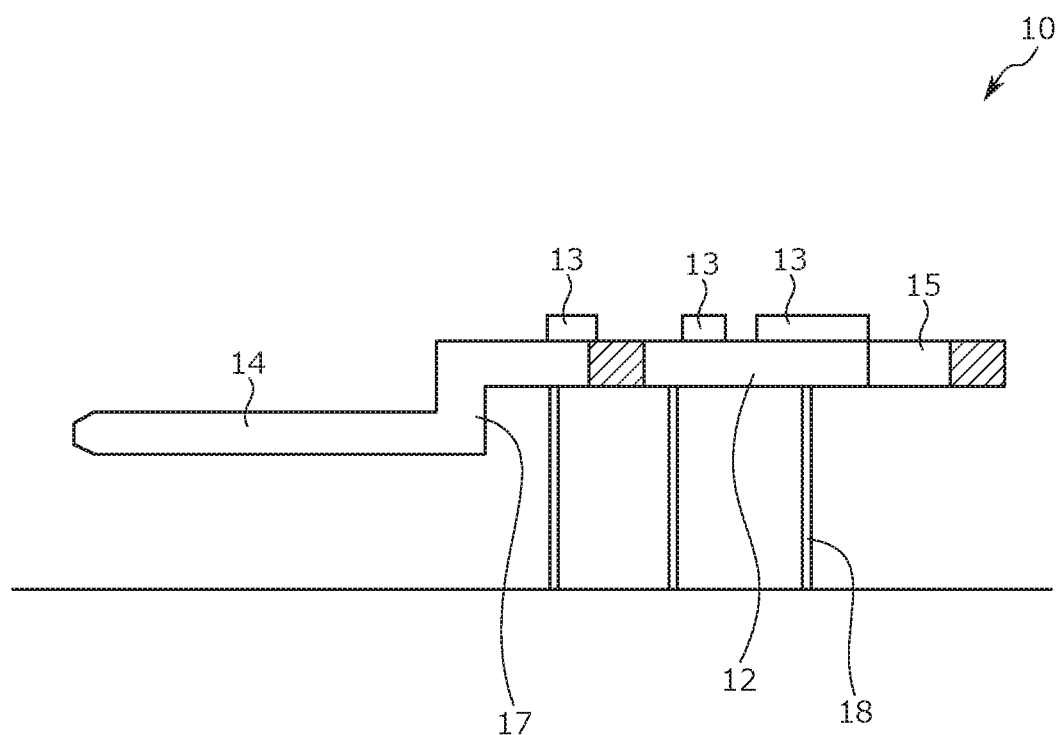
FIG. 17 is a cross-sectional view taken along line A-A of FIG. 16.

As illustrated in FIGS. 16 and 17, each of the conductive members 11 has the circuit portion 12, the electrode pad 13 (an example of the first connection portion), the connection terminal 14 (an example of the second connection portion), and the vertically extending portion 17.

The conductive member 11 has a part bent in a crank shape such that the heights of the circuit portion 12 and the connection terminal 14 are different from each other. The configuration of each portion of the conductive member 11 will be described below.

A light-emitting element such as an LED and a device such as a resistance element are attached to the electrode pad 13.

The connection terminal 14 is a horizontally extending terminal connected to an external power supply circuit or control circuit.

The vertically extending portion 17 vertically extends, the upper end of the vertically extending portion 17 is connected to the circuit portion 12, and the lower end of the vertically extending portion 17 is connected to the connection terminal 14.

The circuit portion 12 horizontally extends and connects the vertically extending portion 17 and the electrode pad 13.

As illustrated in FIG. 17, the conductive member lot 10 is supported by a columnar support member 18 supporting the lower portion of the electrode pad 13.

Second Process

Figure 18:
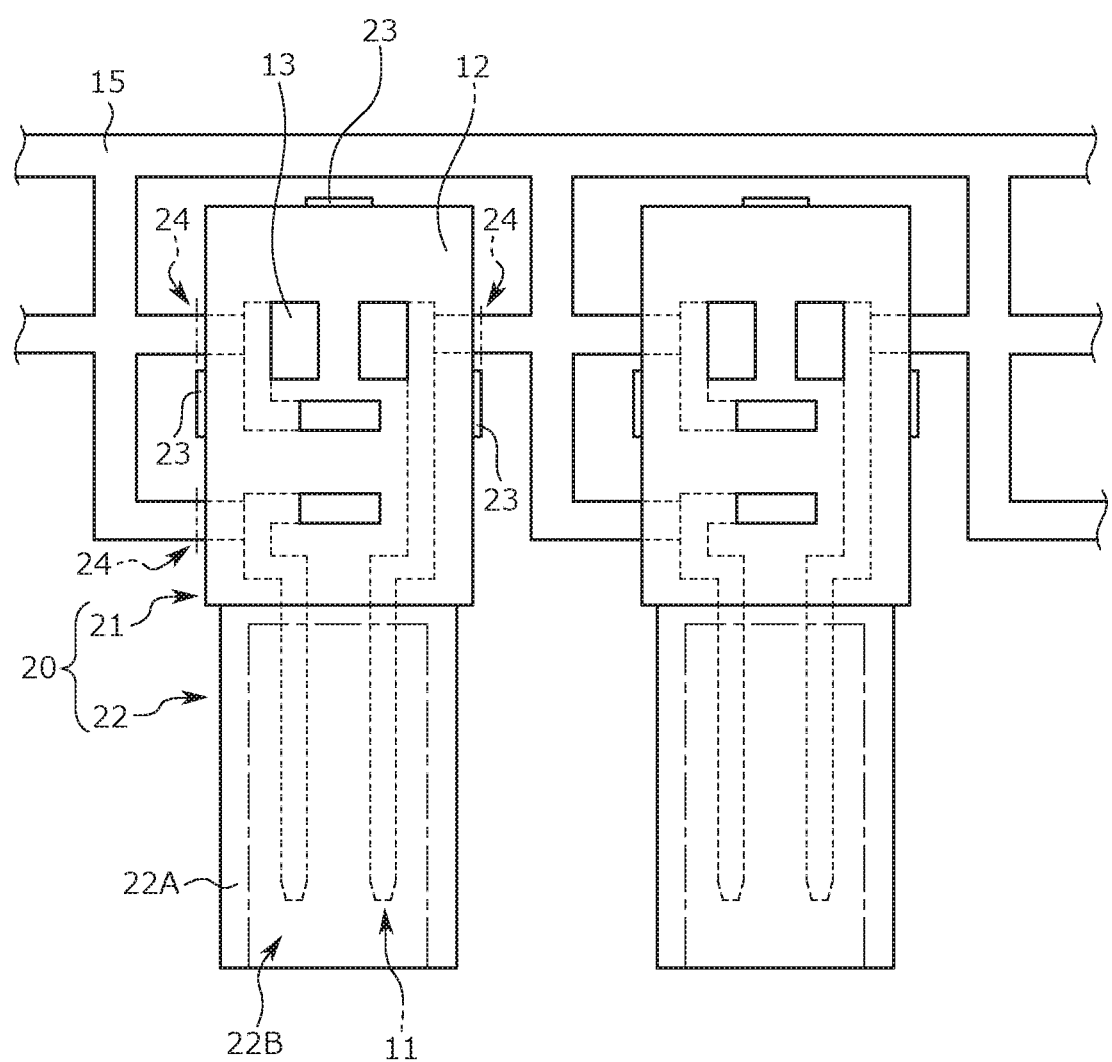
FIG. 18 is a diagram illustrating a state where a holding member is insert-molded in the conductive member lot.

Next, as illustrated in FIG. 18, the holding members 20 are formed by injection molding being performed on a resin material (that is, by insert molding) in a state where the conductive member 11 is inserted. The holding member 20 is molded in a state where the conductive member 11 is supported by the support member 18.

A liquid crystal polymer, polybutylene terephthalate (PBT), polyphenylene sulfide (PPS), and so on may be used as the resin material.

Incidentally, the holding members 20 are molded one by one with respect to each conductive member 11. Details of the configuration of the holding members 20 will be described later.

Third Process

After the holding member 20 is molded, the connecting portion 15 of the conductive member lot 10 is cut at the cutting point 24 in the vicinity of the holding member 20. The substrate portion 2 illustrated in FIGS. 19 to 21 is manufactured as a result.

Figure 19:
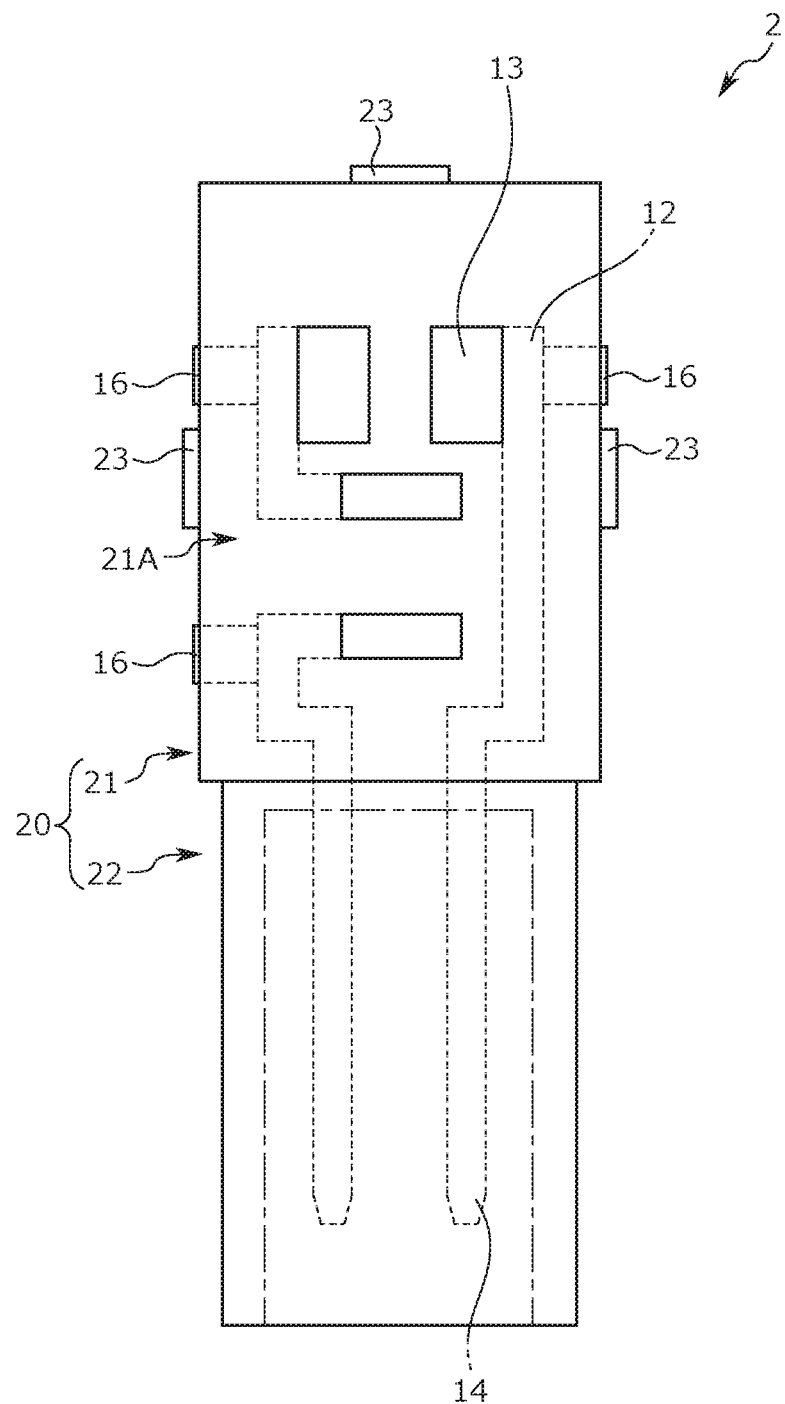
FIG. 19 is a top view of a substrate portion of a light-emitting device according to a fourth embodiment.
Figure 20:
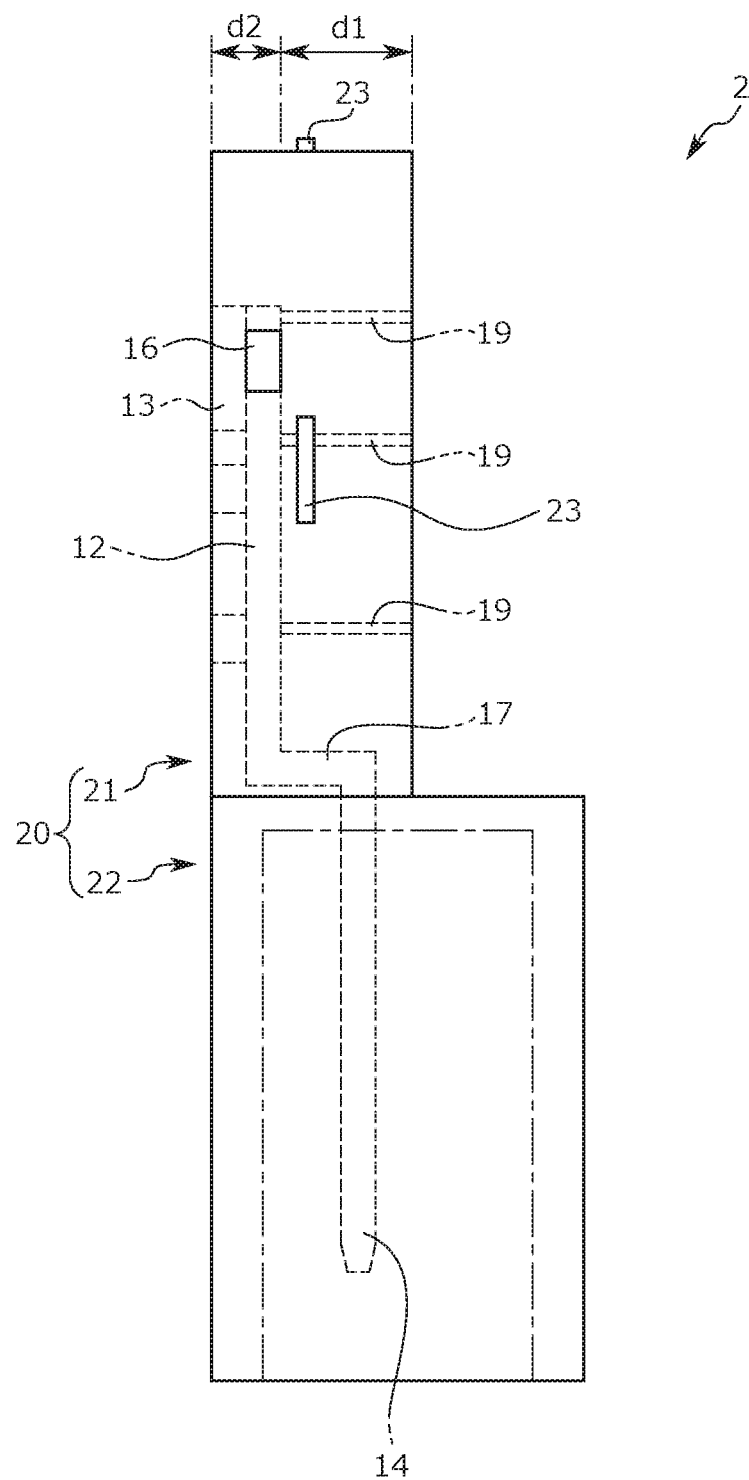
FIG. 20 is a side view of the substrate portion of the light-emitting device according to the fourth embodiment.
Figure 21:
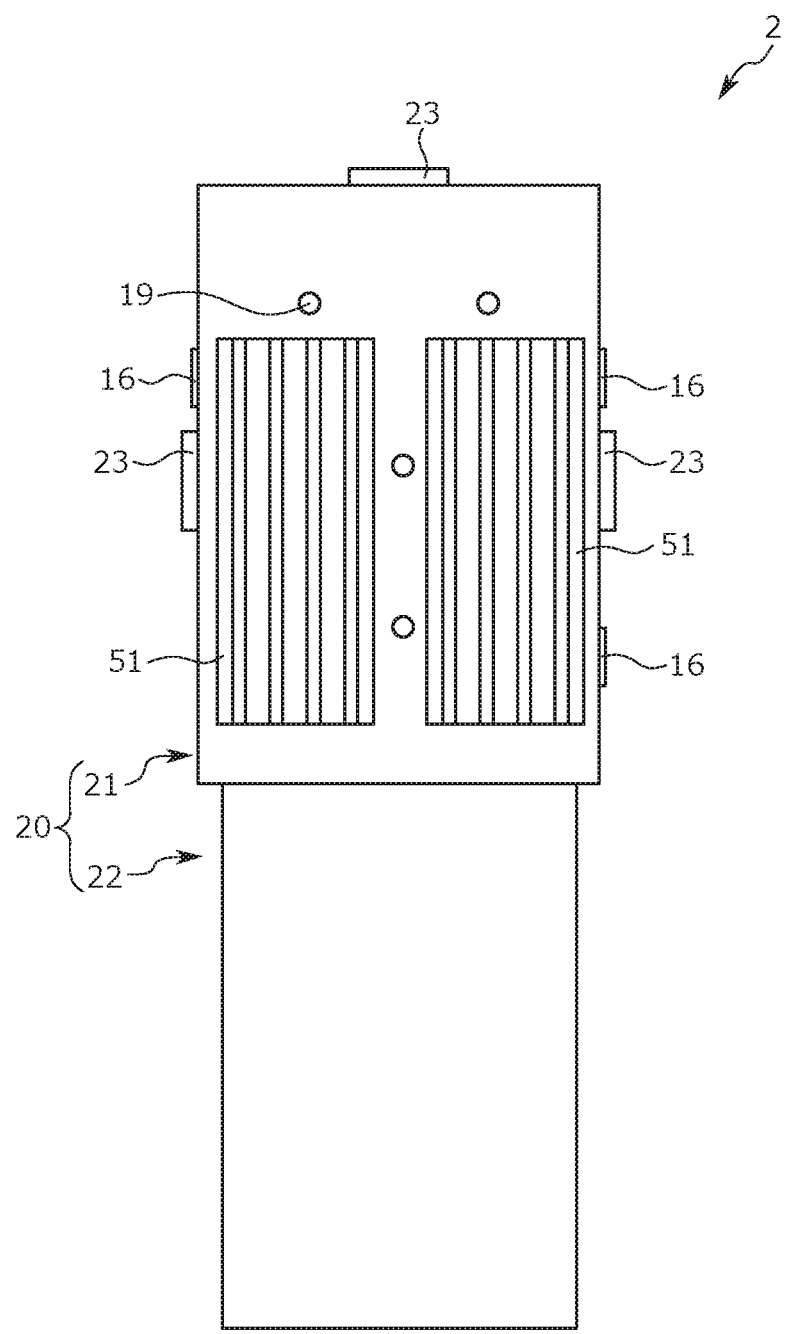
FIG. 21 is a bottom view of the substrate portion of the light-emitting device according to the fourth embodiment.

As illustrated in FIGS. 19 to 21, the conductive member 11 and the holding member 20 constitute the substrate portion 2. The configuration of the conductive member 11 is as described above, and thus the configuration of the holding member 20 will be described below.

As illustrated in FIGS. 19 to 21, the mounting portion 21 and the accommodating portion 22 constitute the holding member 20.

The electrode pad 13 is held on the upper surface of the mounting portion 21, and at least a part of the circuit portion 12 connected to the electrode pad 13 is embedded in the mounting portion 21.

As illustrated in FIGS. 20 and 21, holes 19 are formed from the circuit portion 12 to the lower surface of the mounting portion 21 below the point of the mounting portion 21 where the electrode pad 13 is formed. The holes 19 are formed when the support member 18 is removed from the molded holding member 20.

Incidentally, the distance (d1) between the circuit portion 12 and the lower surface of the mounting portion 21 exceeds the distance (d2) between the circuit portion 12 and the upper surface of the mounting portion 21.

As a result, even in a case where a liquid such as water infiltrates into the holding member 20 through the hole 19, the liquid is unlikely to reach the conductive member 11.

As illustrated in FIG. 21, a heat sink portion 51 is formed in the holding member 20. A plurality of fins (plate-shaped members) each arranged in parallel are formed in the heat sink portion 51, and the heat dissipation of the holding member 20 is enhanced by an increase in the area of contact with the outside air.

Although a plurality of the heat sink portions 51 are formed at positions avoiding the holes 19 in the present embodiment, the aspect of the heat sink portion 51 is not limited to what is illustrated in FIG. 6.

The accommodating portion 22 has a hollow shape and the connection terminal 14 is accommodated in the accommodating portion 22.

As illustrated in FIG. 20, the heights of the upper surface of the mounting portion 21 and the upper surface of the accommodating portion 22 substantially coincide with each other in side view.

As a result, solder paste application and reflow processing during electronic element attachment to the electrode pad 13 (described later) are facilitated.

An opening portion is formed at the part of the mounting portion 21 that faces the electrode pad 13 on the upper surface, and the electrode pad 13 is exposed from the opening portion. The main part of the circuit portion 12 is embedded in the mounting portion 21.

As illustrated in FIGS. 19 to 21, the claw portions 23 are formed on the side surfaces of the mounting portion 21.

Incidentally, in the present embodiment, the claw portion 23 is formed on each of the three side surfaces of the mounting portion 21 that are not connected to the accommodating portion 22. The claw portion 23 is an engagement portion projecting to the outside.

On the side surface of the mounting portion 21, the exposed portion 16 of the conductive member 11 is exposed to the outside of the holding member 20.

Here, the exposed portion 16 and the claw portion 23 are formed at positions not overlapping each other in top view.

Fourth Process

Next, solder paste is applied to the substrate portion 2 in a state where a point other than the electrode pad 13 on which an electronic element such as the light-emitting element 30 and the resistance element 35 is mounted is masked.

Fifth Process

Next, an electronic element such as the light-emitting element 30 and the resistance element 35 is disposed on the electrode pad 13 and heating is performed in a reflow furnace.

Figure 22:
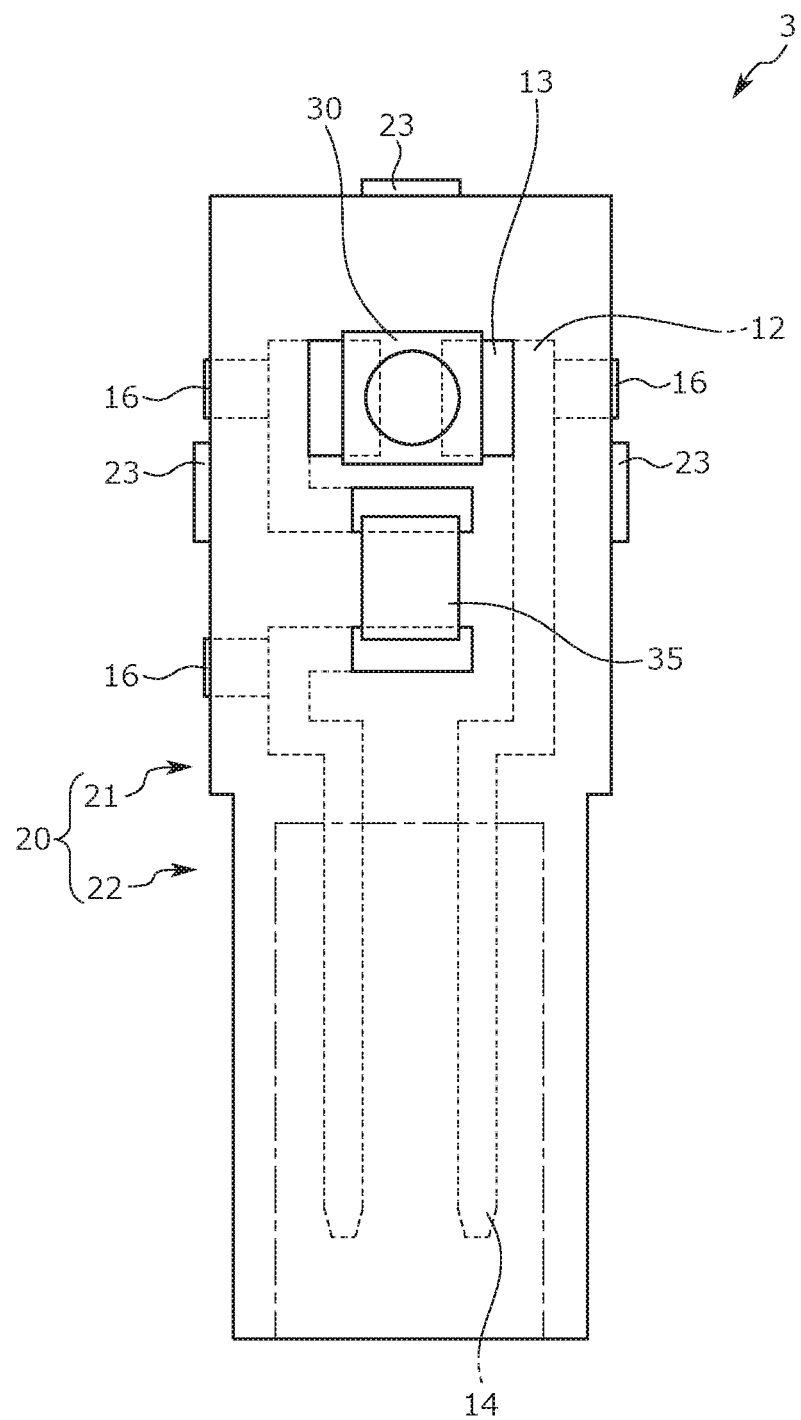
FIG. 22 is a top view of a main body portion of the light-emitting device according to the fourth embodiment.
Figure 23:
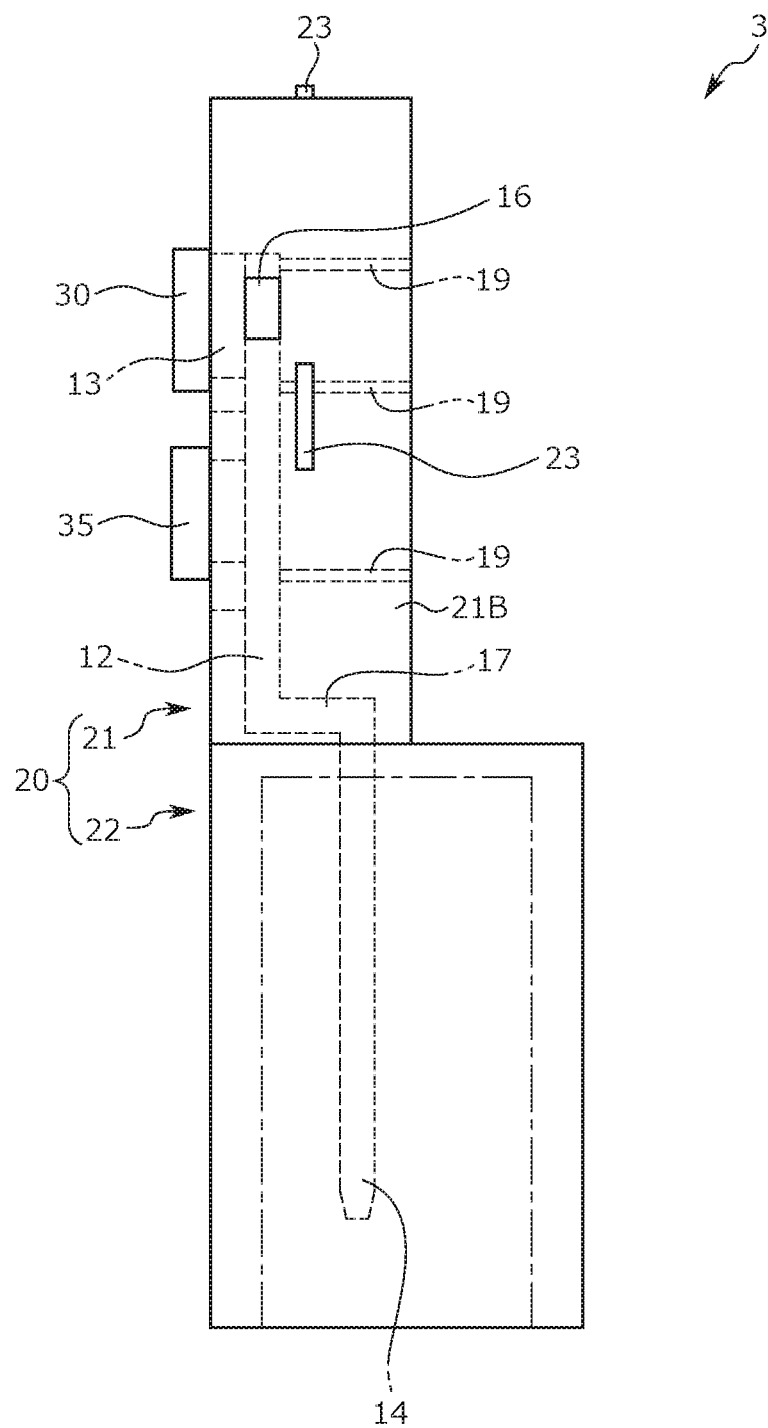
FIG. 23 is a side view of the main body portion of the light-emitting device according to the fourth embodiment.

As a result, the main body portion 3 in which an electronic element such as the light-emitting element 30 and the resistance element 35 is mounted on the substrate portion 2 is manufactured as illustrated in FIGS. 22 and 23.

Sixth Process

Next, the cover member 40 is attached to the main body portion 3. Incidentally, although the light-emitting device 1 is the main body portion 3 to which the cover member 40 is attached in the present embodiment, the present invention is not limited thereto and the main body portion 3 to which the cover member 40 is not attached may be the light-emitting device.

Here, the configuration of the cover member 40 will be described with reference to FIGS. 24 and 25. The cover member 40 is a transparent member formed of plastic, acryl, glass, or the like.

Incidentally, the entire cover member 40 does not have to be constituted by a transparent member and only the lens portion 41 (described later) may be constituted by a transparent member.

Figure 24:
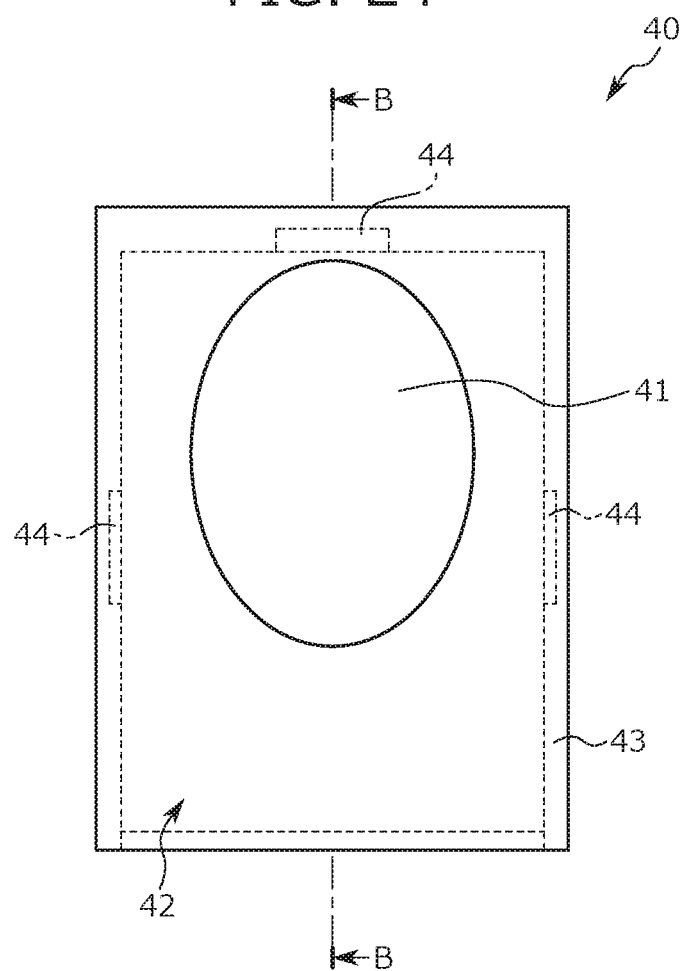
FIG. 24 is a top view of a cover member according to the fourth embodiment.
Figure 25:
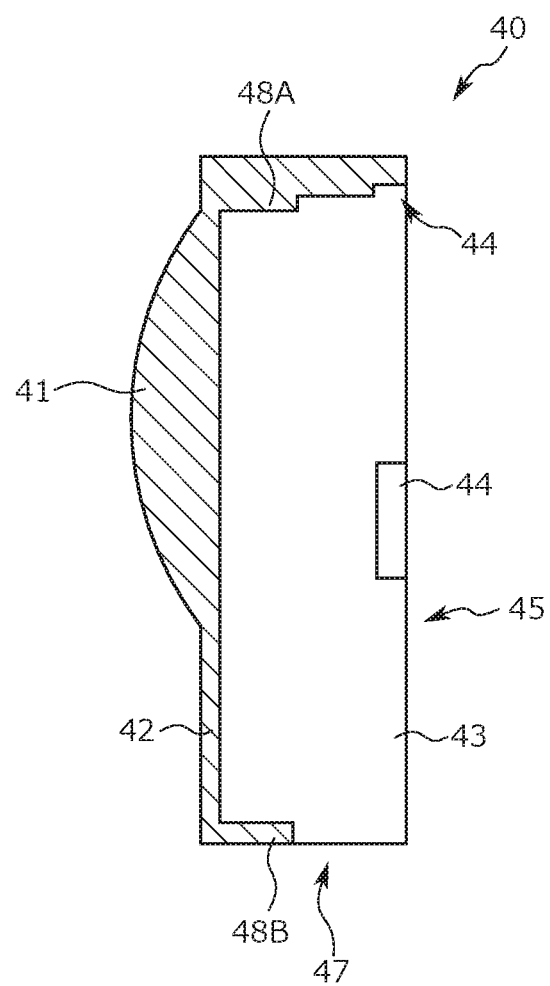
FIG. 25 is a cross-sectional view of the cover member taken along line B-B of FIG. 24.

As illustrated in FIGS. 24 and 25, the cover member 40 is provided with the upper surface portion 42 where the lens portion 41 is formed and the side surface portion 43 having an inner surface where the recess 44 is formed.

The lens portion 41 may be formed integrally with the upper surface portion 42 or may be configured by a separate lens being fitted into a through hole formed in the upper surface portion 42.

The second abutting portion 48B and the first abutting portion 48A protruding downward are formed on the back surface of the upper surface portion 42. The first abutting portion 48A and the second abutting portion 48B are formed at positions where the lens portion 41 is sandwiched. The first abutting portion 48A and the second abutting portion 48B are parts abutting against the upper surface of the mounting portion 21 when the cover member 40 is attached to the main body portion 3.

The lower surface side of the cover member 40 that faces the upper surface portion 42 is open, and this opening part is the first opening portion 45.

A part of the side surface of the cover member 40 (lower side in the drawing) is also open, and this opening part is the second opening portion 47.

In the present embodiment, the cover member 40 is pushed into the main body portion 3 in a state where the first opening portion 45 of the cover member 40 is aligned with the upper surface of the mounting portion 21 of the main body portion 3 and the second opening portion 47 of the cover member 40 is directed to the accommodating portion 22 side of the main body portion 3. As a result, the claw portion 23 of the main body portion 3 fits into the recess 44 of the cover member 40 and the cover member 40 is fixed to the main body portion 3. At this time, rattling of the cover member 40 can be suppressed by each of the first abutting portion 48A and the second abutting portion 48B of the cover member 40 abutting against the upper surface of the mounting portion 21.

Figure 26:
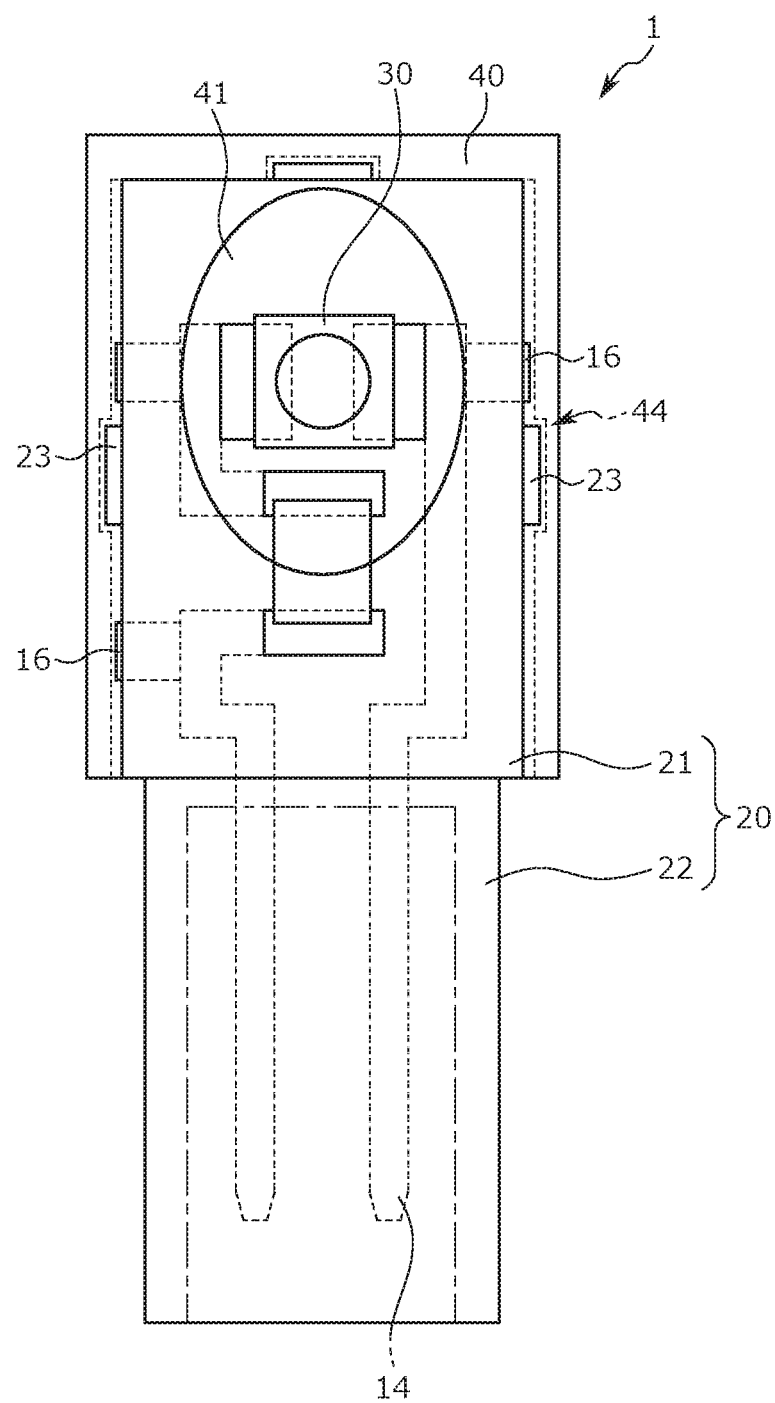
FIG. 26 is a top view of the light-emitting device according to the fourth embodiment.
Figure 27:
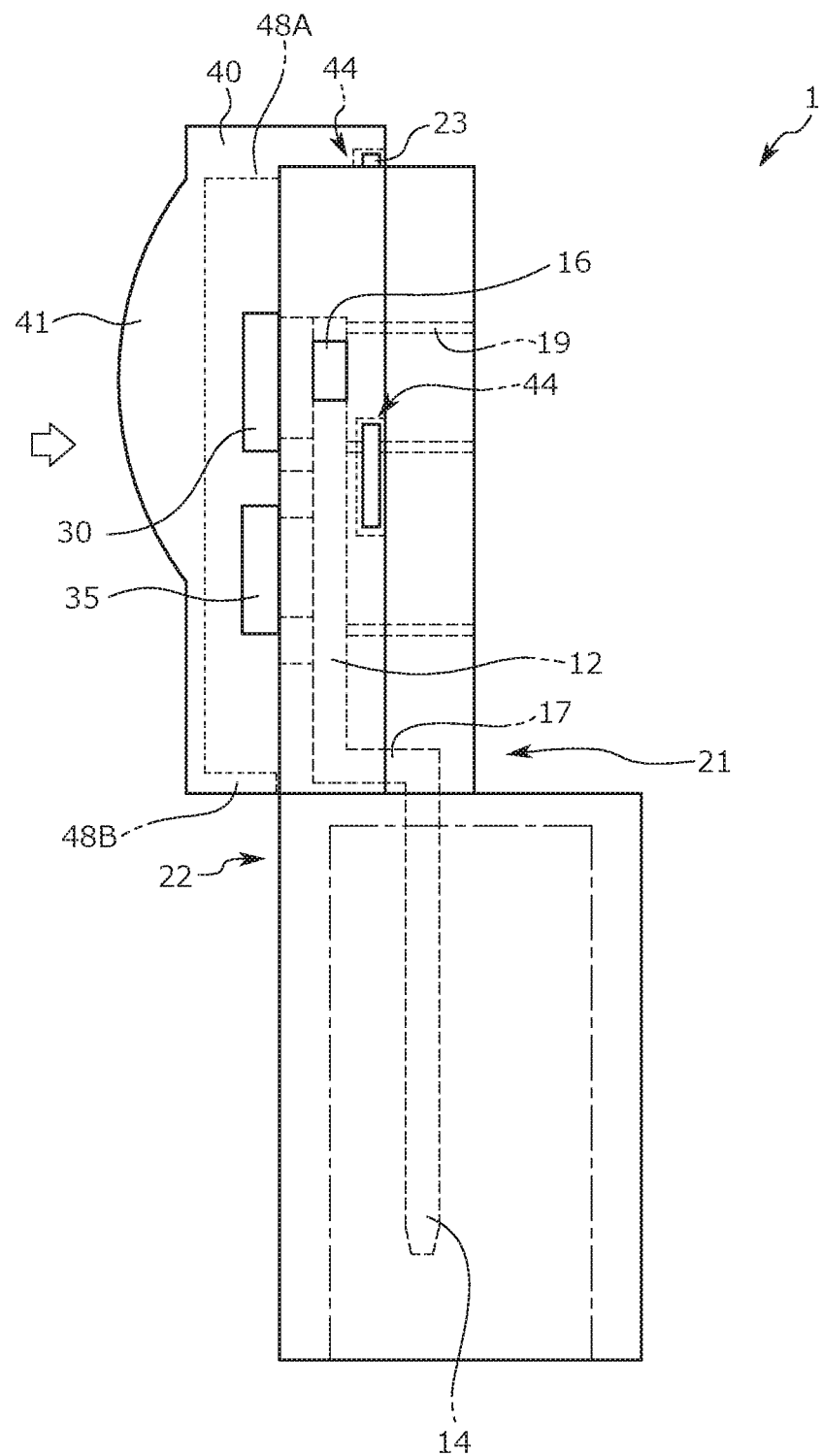
FIG. 27 is a side view of the light-emitting device according to the fourth embodiment.
Figure 28:
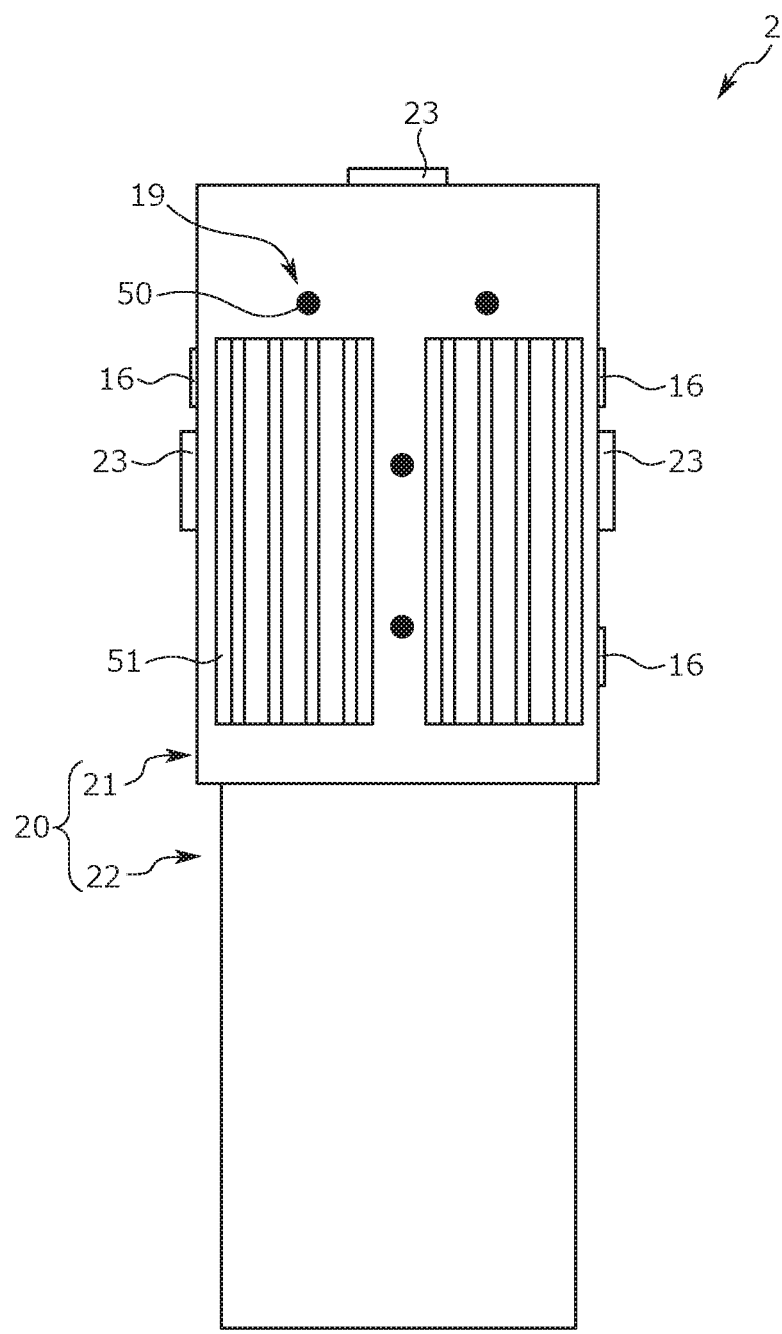
FIG. 28 is a bottom view of a substrate portion of a light-emitting device according to a modification example.

The light-emitting device 1 illustrated in FIGS. 26 and 27 is completed through the above processes.

In the light-emitting device 1 described above, the mounting portion 21 holding the electrode pad 13 to which the light-emitting element 30 is attached and the accommodating portion 22 accommodating the connection terminal 14 are provided at positions not vertically overlapping each other, and thus the heat of the mounting portion 21 is unlikely to be transmitted to the accommodating portion 22. Accordingly, no heat is likely to be stagnant in the accommodating portion 22. As a result, the heat dissipation of the light-emitting device 1 can be enhanced.

By the respective upper surfaces of the mounting portion 21 and the accommodating portion 22 being substantially on the same plane, reflow processing for attaching the light-emitting element 30 to the mounting portion 21 is facilitated.

It is possible to suppress a liquid such as water that has infiltrated from the hole 19 reaching the conductive member 11 by increasing the distance between the lower surface of the mounting portion 21 and the hole 19 formed when the support member 18 supporting the conductive member 11 when the holding member 20 is molded is removed. As a result, the waterproofness of the light-emitting device 1 can be enhanced.

By the heat sink portion 51 being provided in the mounting portion 21, the heat dissipation from the mounting portion 21 can be improved. As a result, a rise in the temperature of the light-emitting device 1 can be suppressed and stability enhancement can be achieved.

In the light-emitting device 1, the conductive member 11 has the vertically extending portion 17 and the circuit portion 12 connecting one end of the vertically extending portion 17 and the electrode pad 13 and the connection terminal 14 is configured to be connected to the other end of the vertically extending portion 17. As a result, the design freedom of the light-emitting device 1 can be enhanced.

Here, the connection angle between the vertically extending portion 17 and the circuit portion 12 and the connection angle between the vertically extending portion 17 and the connection terminal 14 may be right angles or non-right angles.

As described above, in the mass production process for the light-emitting device 1, a part of the conductive member 11 is exposed as the exposed portion 16 from the side portion of the holding member 20.

However, as illustrated in FIGS. 26 and 27, in the light-emitting device 1, the side surface portion 43 of the cover member 40 covers all the exposed portions 16 of the side portion of the mounting portion 21 of the main body portion 3. Accordingly, the occurrence of a short circuit can be suppressed with the light-emitting device 1.

As illustrated in FIGS. 26 and 27, in the light-emitting device 1, the cover member 40 has the lens portion 41 disposed at a position facing the light-emitting element 30.

As a result, the light-emitting device 1 can be reduced in size as compared with a case where the cover member 40 and the lens portion 41 are separately configured.

As illustrated in FIGS. 26 and 27, in the light-emitting device 1, the recess 44 of the cover member 40 engaged with the claw portion 23 of the holding member 20 is formed at a position not overlapping the lens portion 41 in top view.

As a result, even in a case where a manufacturing error occurs in the recess 44 of the cover member 40, it is possible to reduce the effect of the error on the lens portion 41. As a result, variations in the accuracy of the optical system of the light-emitting device 1 can be reduced.

As illustrated in FIGS. 26 and 27, in the light-emitting device 1, the claw portion 23 is formed at a position not overlapping the exposed portions 16 in top view.

As a result, interference of the exposed portion 16 with the engagement between the cover member 40 and the holding member 20 can be suppressed.

The present invention is not limited to the above embodiment. For example, the hole 19 formed in the lower surface of the holding member 20 may be blocked by means of a blocking member 50 such as paint and resin as illustrated in FIG. 13.

Then, a liquid such as water is prevented from infiltrating into the holding member 20, and thus the waterproofness of the light-emitting device 1 can be enhanced.

In another example, the light-emitting device 1 may be provided with a plurality of the light-emitting elements 30. In addition, the light-emitting element 30 is not limited to an LED and a fluorescent light, a semiconductor laser, and so on may be used as the light-emitting element 30.

Fifth Embodiment

Next, the light-emitting device 1A according to a fifth embodiment will be described with reference to FIG. 29.

The light-emitting device 1A according to the fifth embodiment is different from the light-emitting device 1 according to the fourth embodiment mainly in the configurations of the holding member 20A and a conductive member 11A, and the light-emitting device 1A and the light-emitting device 1 have the other points in common. The above differences will be described below.

First, the holding member 20A of the light-emitting device 1A is different from the holding member 20 of the light-emitting device 1 in that the heights of the upper surface of the mounting portion 21 and the upper surface of the accommodating portion 22 are different from each other. Specifically, the upper surface of the mounting portion 21 is positioned below the upper surface of the accommodating portion 22.

Next, in the conductive member 11A of the light-emitting device 1A, the connection terminal 14 and the circuit portion 12 of the conductive member 11A are connected flat. As a result, no bent portion is formed in the conductive member 11A, and thus the generation of a stress concentration point can be suppressed in the conductive member 11A and the occurrence of deformation or breakage can be prevented.

Figure 29:
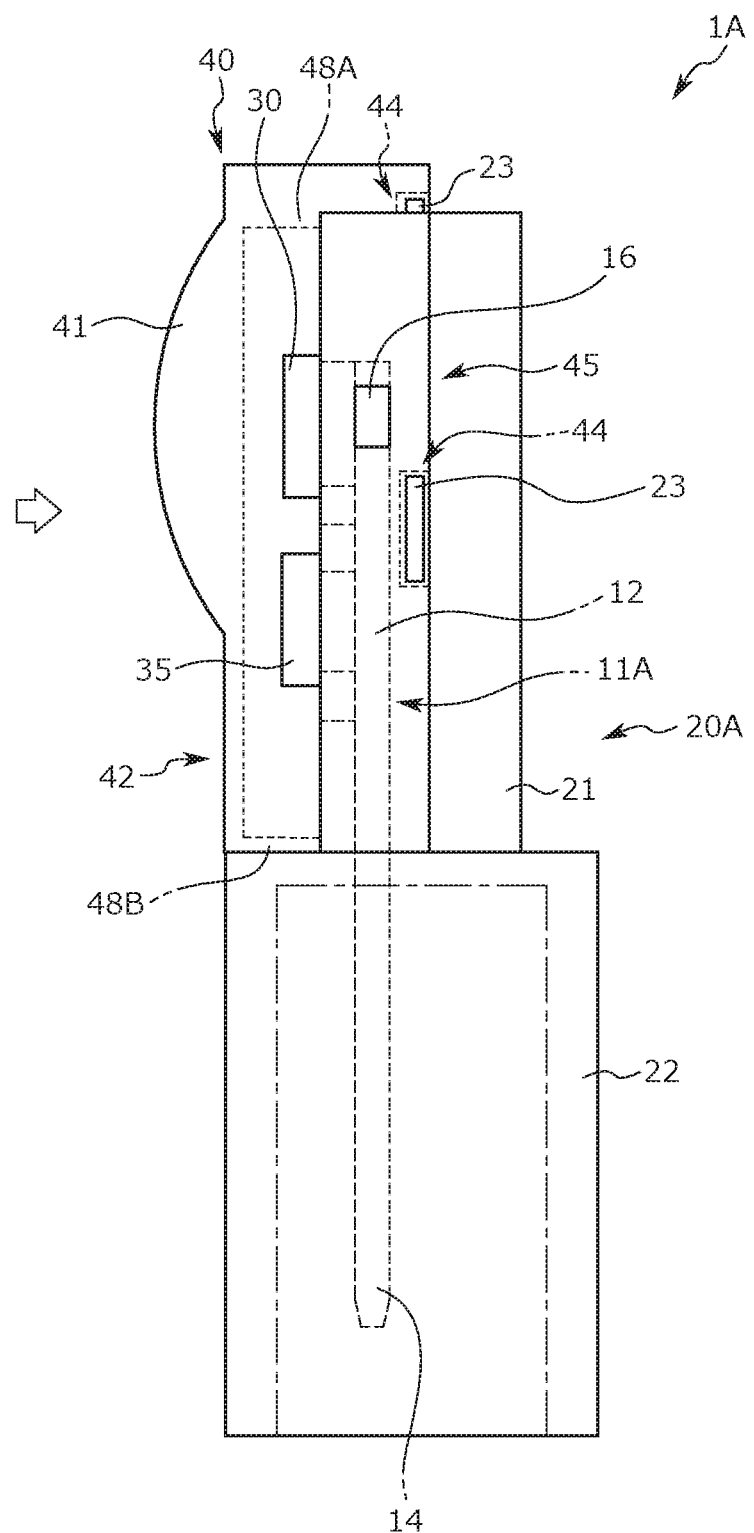
FIG. 29 is a side view of a light-emitting device according to a fifth embodiment.

Incidentally, as illustrated in FIG. 29, in the light-emitting device 1A, the upper surface portion 42 of the cover member 40 and the upper surface portion of the accommodating portion 22 are substantially on the same plane in side view.

As a result, the upper surface portion of the light-emitting device 1 can be configured without a step. As a result, the design of the light-emitting device 1 can be improved.

Sixth Embodiment

Figure 30:
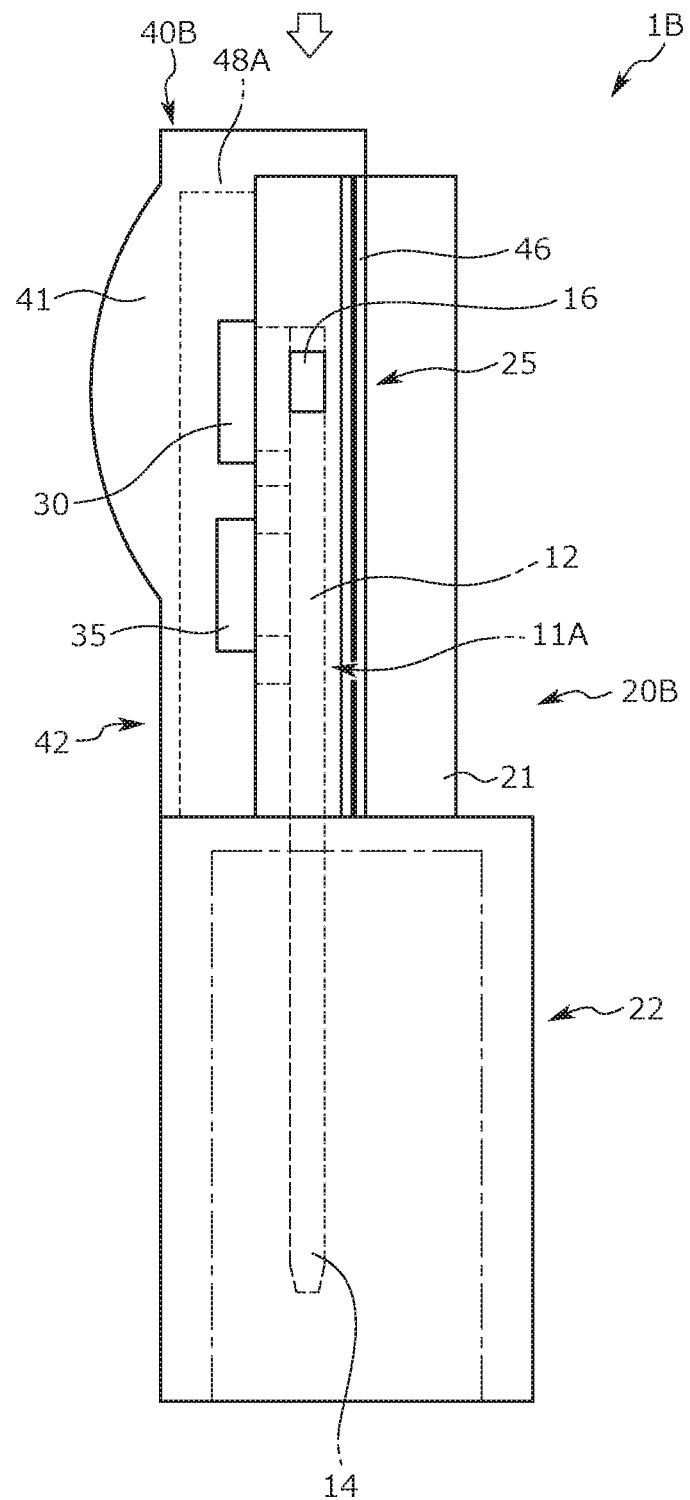
FIG. 30 is a side view of a light-emitting device according to a sixth embodiment.

Next, the light-emitting device 1B according to a sixth embodiment will be described with reference to FIG. 30.

The light-emitting device 1B according to the sixth embodiment is different from the light-emitting device 1A according to the fifth embodiment mainly in the configurations of the holding member 20B and a cover member 40B, and the light-emitting device 1B and the light-emitting device 1A have the other points in common. The above differences will be described below.

First, the holding member 20B of the light-emitting device 1B is different from the holding member 20A in that the slide groove 25 along the direction of extension of the circuit portion 12 is formed in the side surface of the mounting portion 21.

Here, the slide groove 25 is formed so as to extend from one end to the other end of the side surface and is closer to the lower surface side than the exposed portion 16.

Incidentally, the slide grooves 25 are respectively formed in the side surface of the holding member 20B where the exposed portion 16 is exposed.

The cover member 40B of the light-emitting device 1B is different from the cover member 40 in that the projecting portion 46 engaged with the slide groove 25 is formed on the inner surface of the side surface portion. Here, the projecting portion 46 is a linear protruding portion protruding from the inner surface of the side surface portion 43.

In addition, the cover member 40B is different from the cover member 40 in that the second abutting portion 48B is not formed.

In the light-emitting device 1B according to the sixth embodiment, the cover member 40B can be attached to the holding member 20B by the cover member 40B being engaged with the holding member 20B by sliding along the slide groove 25.

In this manner, the cover member 40B can be easily attached to the holding member 20B.

3

Next, another aspect of the present invention will be described.

In some cases, a light-emitting device provided with a light-emitting element such as an LED is used as a light provided in a vehicle. For example, JP 2012-89602 A discloses a light-emitting device in which a cover provided with a lens is fitted in a case with a light-emitting element-mounted circuit and a connection terminal of the circuit attached to the case.

In the related art described in JP 2012-89602 A, the connection portion between circuit-holding and connection terminal-accommodating parts is bent at a right angle in the case, and thus a point of local stress concentration is likely to be generated and problems arise in terms of strength.

The present invention has been made in view of the above problems, and an object of the present invention is to provide a light-emitting device in which the strength of a holding member holding a conductive member to which a light-emitting element is attached is improved.

The above problems are solved by means of the light-emitting device according to the present invention including a conductive member, a holding member holding the conductive member, and a light-emitting element connected to the conductive member. The conductive member is provided with a first connection portion connected to the light-emitting element and a second connection portion connected to an electric power source. The holding member is provided with a mounting portion holding the first connection portion and an accommodating portion in which the second connection portion is accommodated. An inclined surface is formed in a connection portion between the mounting portion and the accommodating portion.

With the light-emitting device described above, it is possible to suppress local stress concentration on the connection portion between the mounting portion and the accommodating portion and improve the strength of the connection portion. As a result, it is possible to improve the strength of the holding member holding the conductive member to which the light-emitting element is attached.

In the light-emitting device described above, it is preferable that the upper surface of the mounting portion is below the upper surface of the accommodating portion.

In this manner, the upper surface of the accommodating portion abuts against an object from above before the upper surface of the mounting portion abuts against the object, and thus the upper surface of the mounting portion can be protected.

It is preferable that the light-emitting device described above further includes a cover member covering the mounting portion, a horizontal surface is formed at a part connecting the accommodating portion and the inclined surface in the connection portion, and the cover member is attached to the mounting portion in a state of abutting against the horizontal surface.

In this manner, the attachment position of the cover member is determined with ease and the cover member is attached with ease. As a result, it is possible to suppress damage to the light-emitting element disposed in the mounting portion when the cover member is attached.

In the light-emitting device described above, it is preferable that the mounting portion has a flat portion connected to the connection portion and the cover member is attached to the mounting portion in a state of abutting against the horizontal surface and the flat portion.

In this manner, rattling of the cover member can be suppressed.

In addition, molding of the mounting portion can be facilitated by the upper surface of the mounting portion being flat.

In the light-emitting device described above, it is preferable that the upper surface of the accommodating portion and the upper surface of the cover member are substantially on the same plane in a state where the cover member is attached to the mounting portion.

In this manner, it is possible to avoid providing a large step on the upper surface of the light-emitting device. As a result, the design of the light-emitting device is improved.

In the light-emitting device described above, it is preferable that the cover member has a lens portion facing the light-emitting element.

In this manner, the light-emitting device can be reduced in size as compared with a case where the cover member and the lens portion are separately configured.

In the light-emitting device described above, it is preferable that the conductive member has an inclined portion inclined between the first connection portion and the second connection portion, the inclined portion is inserted into the connection portion, and the inclined portion and the inclined surface are uniform in direction of inclination.

In this manner, it is possible to protect the inclined portion of the conductive member and make the inclined portion of the conductive member unlikely to break. In addition, the strength of the connection portion can be improved by the inclined portion of the conductive member being inserted in the connection portion of the holding member.

Hereinafter, a light-emitting device 101 according to embodiments of the present invention (hereinafter, the present embodiment) will be described with reference to FIGS. 31 to 37. The light-emitting device 101 is mounted on the interior of a vehicle or the like.

The outline of each of FIGS. 31 to 37 is as follows.

Figure 31:
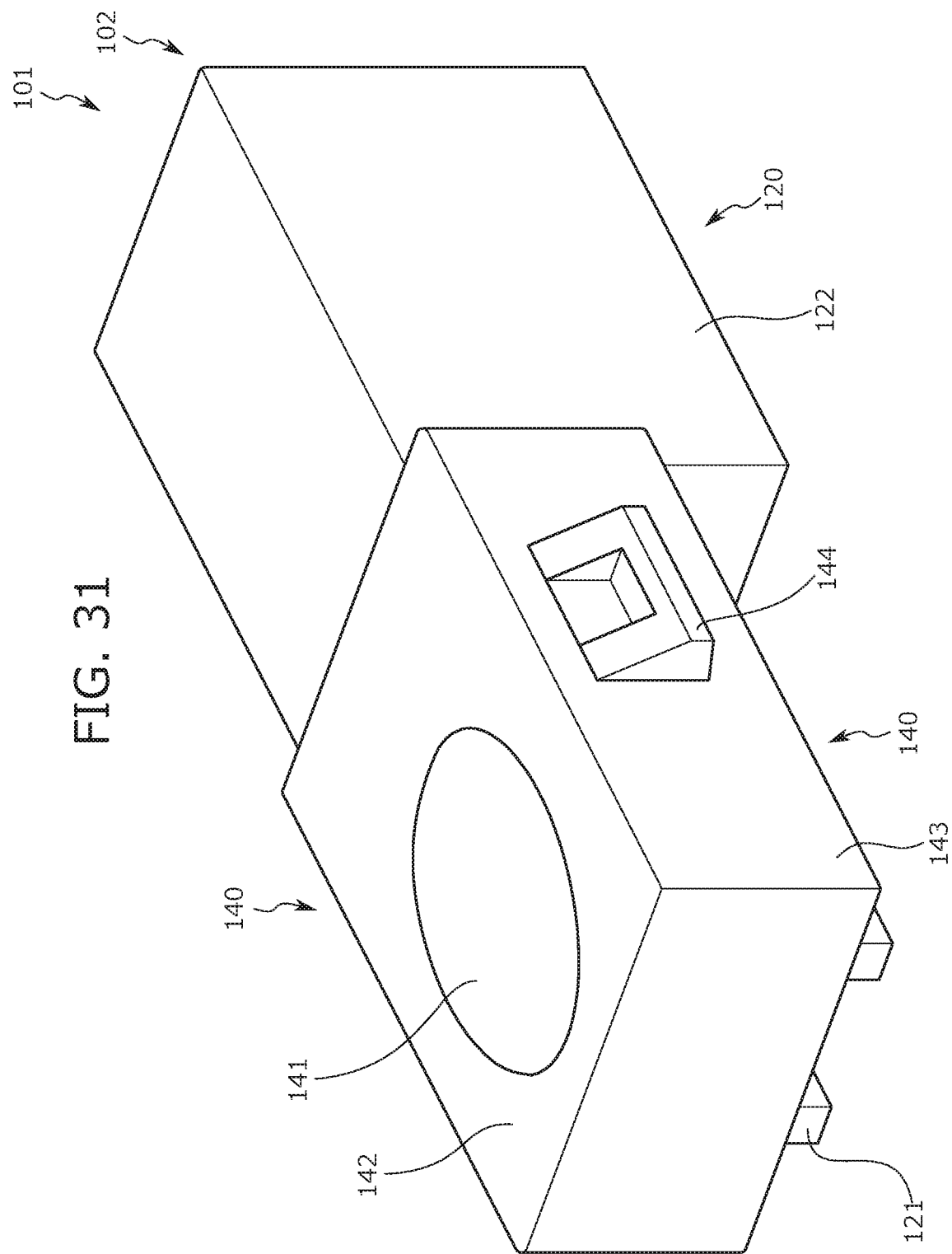
FIG. 31 is a perspective view of a light-emitting device.

FIG. 31 is a perspective view of the light-emitting device 101.

Figure 32:
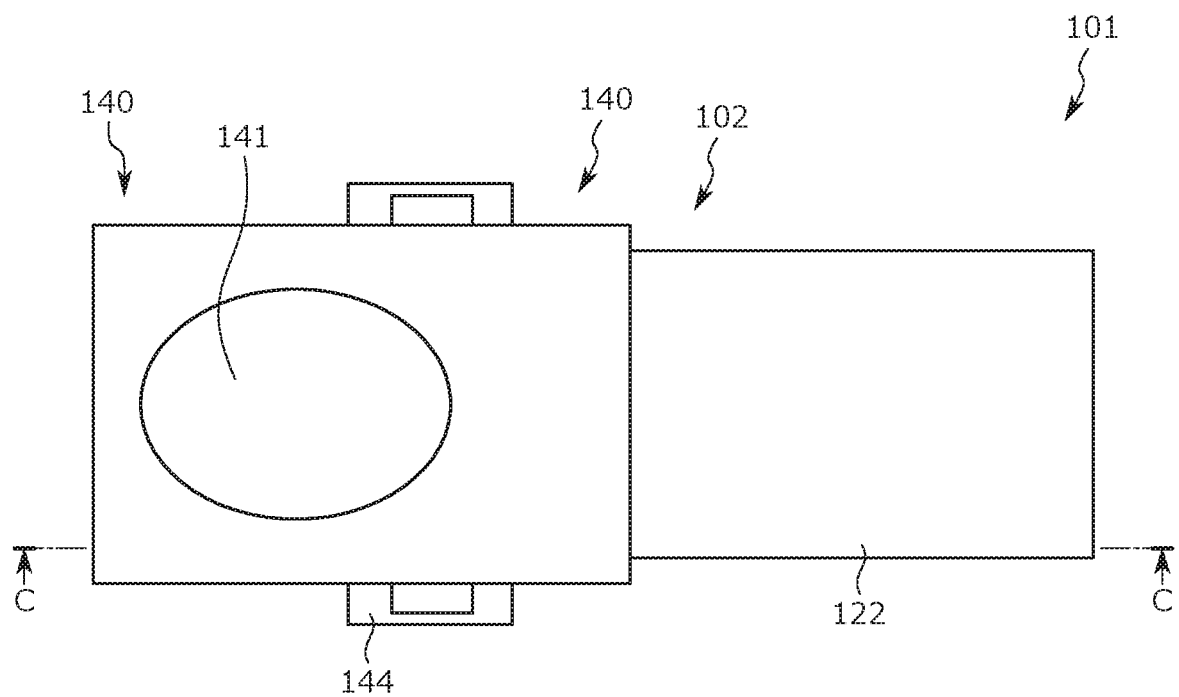
FIG. 32 is a top view of the light-emitting device.

FIG. 32 is a top view of the light-emitting device 101.

Figure 33:
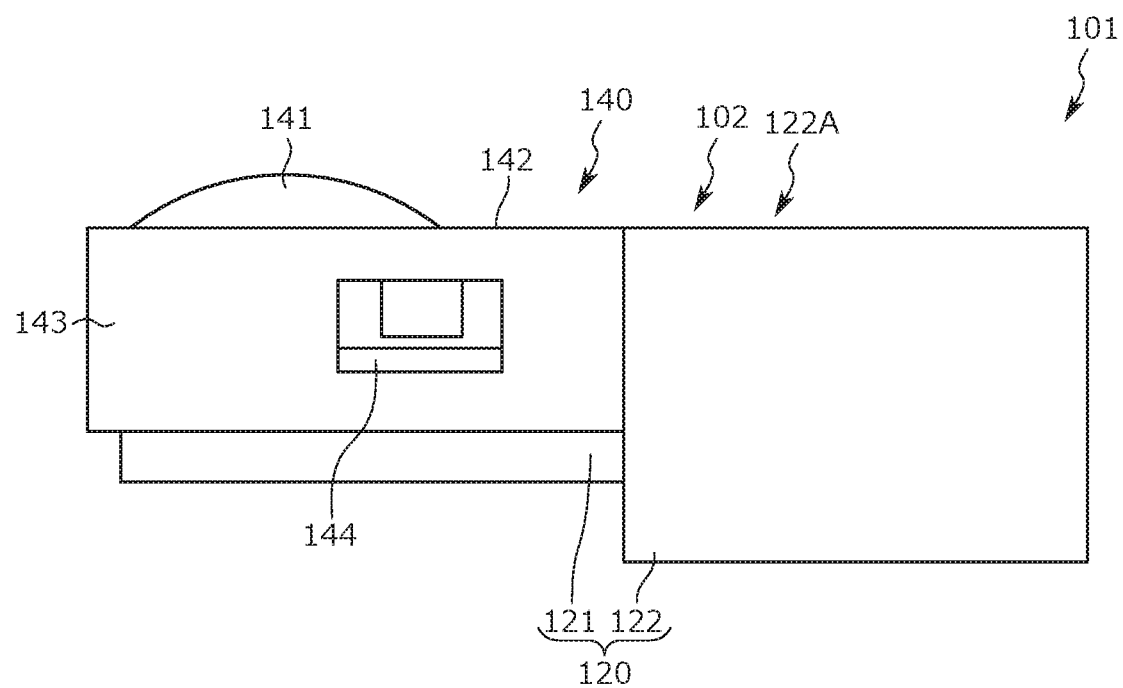
FIG. 33 is a side view of the light-emitting device.

FIG. 33 is a side view of the light-emitting device 101.

Figure 34:
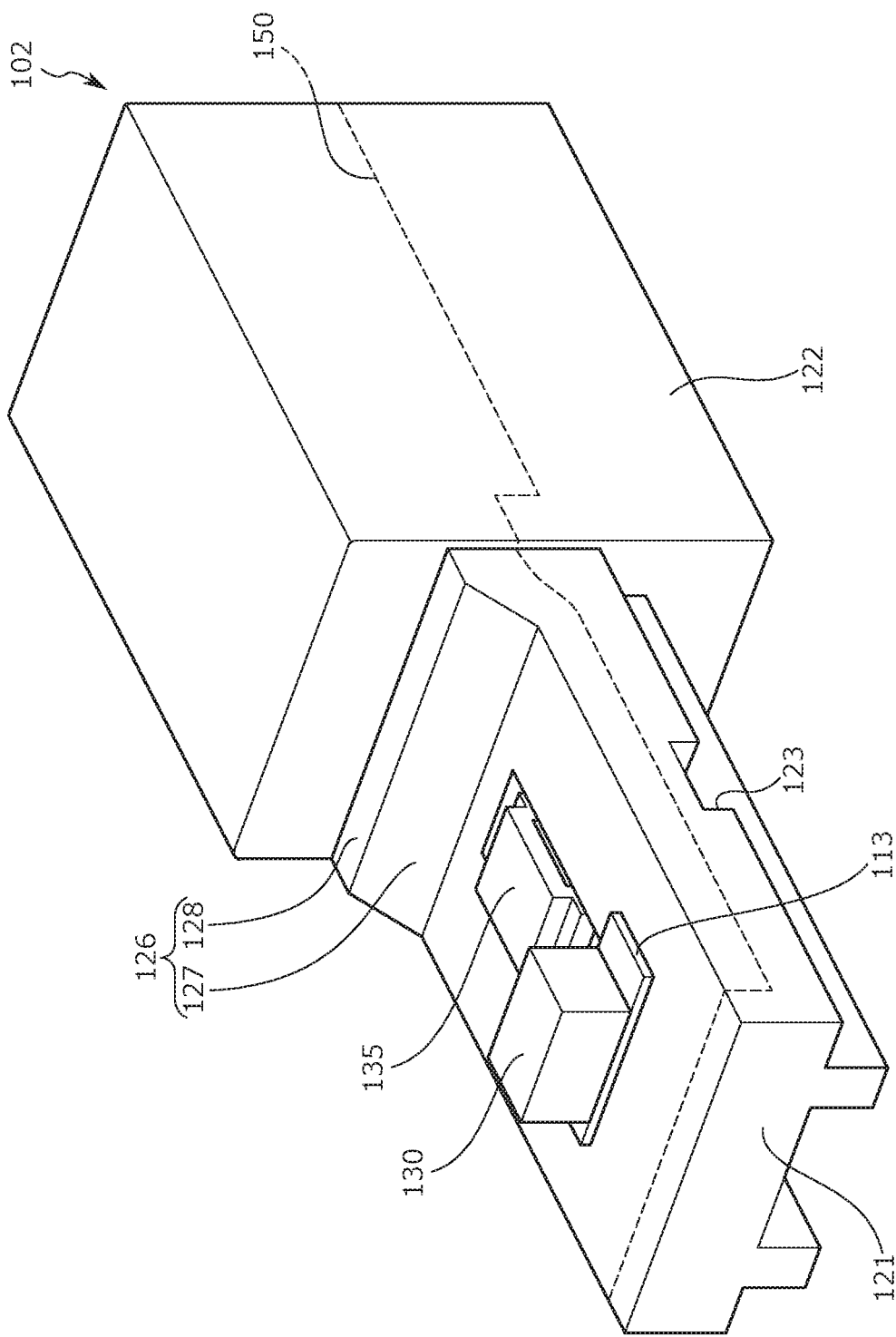
FIG. 34 is a perspective view of a main body portion.

FIG. 34 is a perspective view of a main body portion 102.

Figure 35:
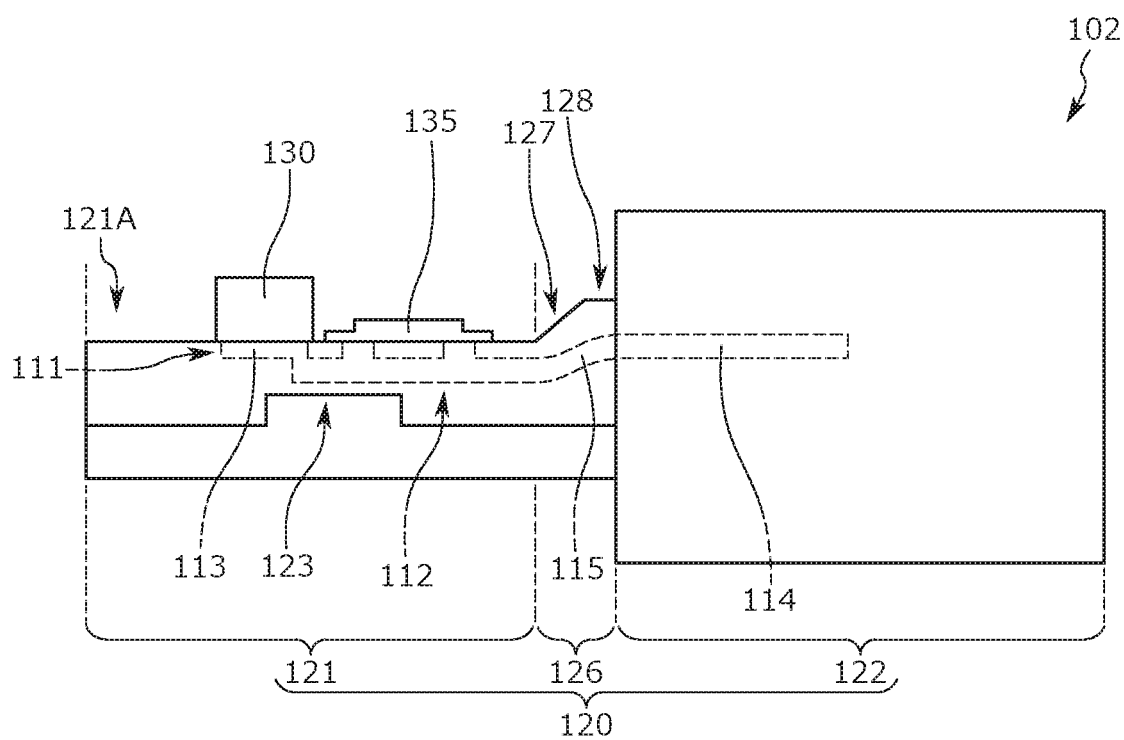
FIG. 35 is a side view of the main body portion.

FIG. 35 is a side view of the main body portion 102.

Figure 36:
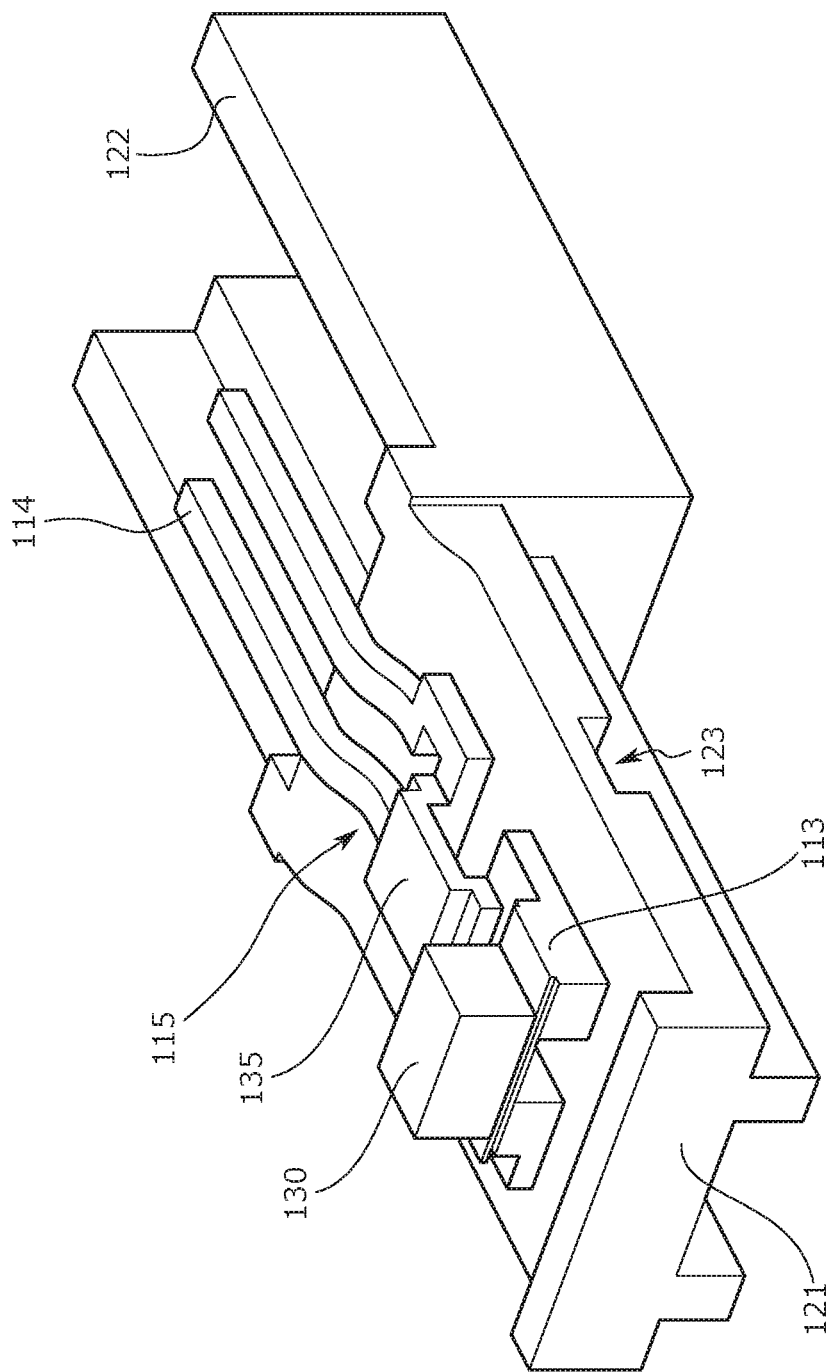
FIG. 36 is a perspective view illustrating a state where the main body portion is cut in a virtual cutting portion.

FIG. 36 is a perspective view illustrating a state where the main body portion 102 is cut in a virtual cutting portion 150.

Figure 37:
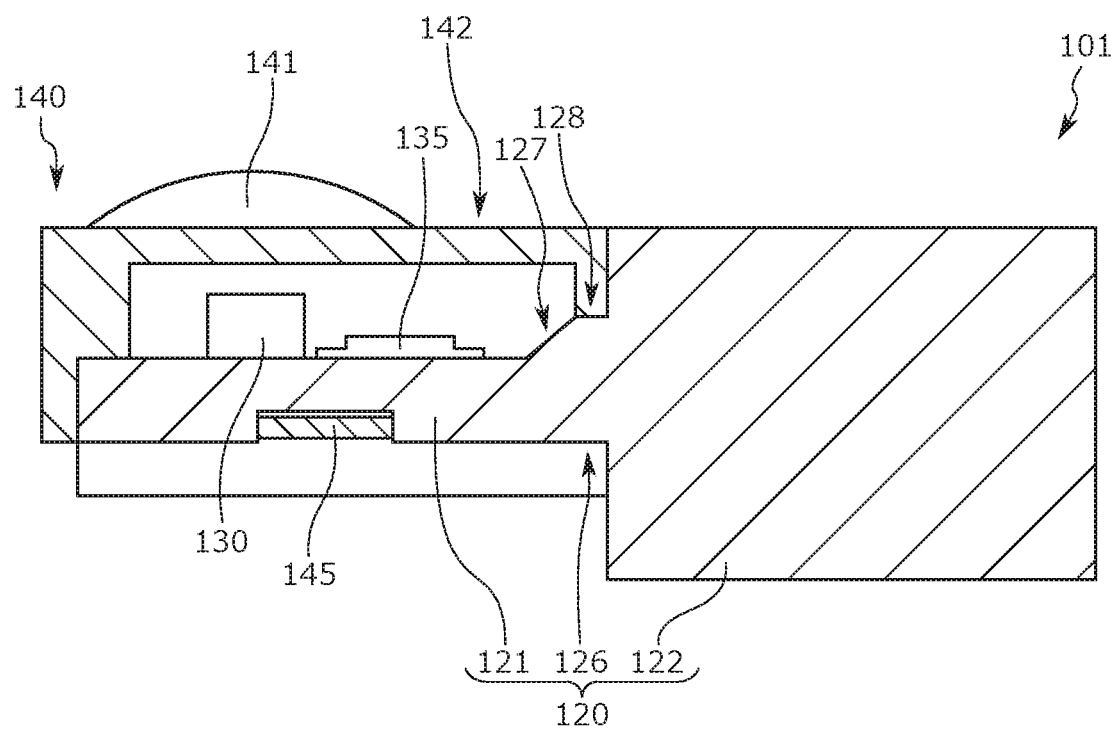
FIG. 37 is a cross-sectional view taken along line C-C of FIG. 32.

FIG. 37 is a cross-sectional view taken along line VII-VII of FIG. 32.

The main body portion 102 corresponds to a state where the cover member 40 is removed from the light-emitting device 101.

Incidentally, the embodiments described below are merely examples for facilitating the understanding of the present invention and do not limit the present invention. In other words, members described below can be modified or improved in shape, dimension, disposition, and so on without departing from the scope of the present invention and it is a matter of course that the present invention includes equivalents of the present invention.

Hereinafter, the surface of the light-emitting device 101 to which a light-emitting element is attached will be referred to as an upper surface, a surface connected to the upper surface will be referred to as a side surface, and a surface facing the upper surface will be referred to as a lower surface. The direction from the upper surface to the lower surface will be referred to as a downward direction and the direction from the lower surface to the upper surface will be referred to as an upward direction.

As illustrated in FIGS. 31 to 33, the light-emitting device 101 is provided with the main body portion 102 and a cover member 140 and is configured by the cover member 140 being fitted into the main body portion 102.

The configuration of the main body portion 102 will be described first.

As illustrated in FIGS. 34 and 35, the main body portion 102 is provided with a conductive member 111, a holding member 120, a light-emitting element 130, and a resistance element 135.

Configuration of Conductive Member 111

The conductive member 111 is an electric circuit. At least a part of the conductive member 111 is inserted into the holding member 120. An electronic element such as the light-emitting element 130 and the resistance element 135 is attached to the conductive member 111.

For example, the conductive member 111 is made of a metal such as copper, steel, and aluminum. Here, the conductive member 111 may be formed by molding or may be formed by punching and bending or the like.

As illustrated in FIGS. 35 and 36, the conductive member 111 has a circuit portion 112, an electrode pad 113 (an example of the first connection portion), a connection terminal 114 (an example of the second connection portion), and an inclined portion 115.

The circuit portion 112 corresponds to a circuit part embedded in a mounting portion 121 of the holding member 120 and extends in, for example, a horizontal direction. The circuit portion 112 is connected to the electrode pad 113 and the inclined portion 115. In this manner, the electrode pad 113 and the connection terminal 114 are connected via the circuit portion 112 and the inclined portion 115.

The electrode pad 113 is connected to the circuit portion 112. The light-emitting element 130 such as an LED and an electronic element such as the resistance element 135 are attached to the electrode pad 113.

The connection terminal 114 is a horizontally extending terminal connected to an external power supply circuit or control circuit.

The inclined portion 115 is an inclined connection portion provided between the circuit portion 112 and the connection terminal 114.

Incidentally, in side view, the connection terminal 114 is above the circuit portion 112 and the inclined portion 115 is inclined in the direction of becoming higher from the point of connection to the circuit portion 112 toward the point of connection to the connection terminal 114.

Configuration of Holding Member 120

Next, the configuration of the holding member 120 will be described.

As illustrated in FIGS. 34 to 37, the mounting portion 121, an accommodating portion 122, and a connection portion 126 constitute the holding member 120. Here, the connection portion 126 is a part connecting the mounting portion 121 and the accommodating portion 122.

For example, the holding member 120 may be formed by injection molding being performed on a resin material (that is, by insert molding) in a state where the conductive member 111 is inserted. In this case, the mounting portion 121, the accommodating portion 122, and the connection portion 126 are integrally molded.

Incidentally, a liquid crystal polymer, polybutylene terephthalate (PBT), polyphenylene sulfide (PPS), and so on may be used as the resin material.

The mounting portion 121 is a part holding the electrode pad 113 and the circuit portion 112 of the conductive member 111. Specifically, an opening is formed at a position corresponding to the electrode pad 113 in a flat portion 121A, which is the upper surface of the mounting portion 121, and the electrode pad 113 is exposed from the opening. The main part of the circuit portion 112 is embedded in the mounting portion 121.

The flat portion 121A constitutes a flat surface extending in the horizontal direction.

As illustrated in FIG. 35, the flat portion 121A is connected to the connection portion 126. Specifically, the flat portion 121A is connected to an inclined surface 127 of the connection portion 126 in the end portion on the side that is close to the connection terminal 114.

As illustrated in FIG. 37, the flat portion 121A is apart against which the cover member 140 attached to the main body portion 102 abuts. Specifically, the flat portion 121A abuts against the cover member 140 in the vicinity of the end portion on the side that is far from the connection terminal 114.

As illustrated in FIGS. 34 to 36, a claw locking portion 123 is formed in the side portion of the mounting portion 121. As illustrated in FIG. 37, a claw portion 145 provided on the inner surface of a side surface portion 143 of the cover member 140 is fitted into the claw locking portion 123 in a state where the cover member 140 is attached to the main body portion 102.

The accommodating portion 122 has a hollow shape and the connection terminal 114 of the conductive member 111 is accommodated in the accommodating portion 122.

The connection portion 126 is a part connecting the mounting portion 121 and the accommodating portion 122 in the holding member 120. As illustrated in FIGS. 35 and 36, the inclined portion 115 of the conductive member 111 is inserted (embedded) in the connection portion 126.

As illustrated in FIG. 35, the inclined surface 127 and a horizontal surface 128 are formed on the upper surface of the connection portion 126. Here, the inclined surface 127 is positioned on the side that is far from the connection terminal 114 and the horizontal surface 128 is positioned on the side that is close to the connection terminal 114.

The inclined surface 127 is connected to the flat portion 121A in the end portion on the side that is far from the connection terminal 114 and is connected to the horizontal surface 128 in the end portion on the side that is close to the connection terminal 114.

The inclined surface 127 is inclined in the direction of becoming higher from the point of connection to the flat portion 121A toward the point of connection to the horizontal surface 128. In other words, the direction of inclination of the inclined surface 127 and the direction of inclination of the inclined portion 115 of the conductive member 111 are uniform. Here, the inclination angle of the inclined surface 127 and the inclination angle of the inclined portion 115 may be substantially equal to each other or the inclination angle of the inclined surface 127 may exceed the inclination angle of the inclined portion 115.

The horizontal surface 128 forms a flat surface extending in the horizontal direction. The horizontal surface 128 is connected to the inclined surface 127 in the end portion on the side that is far from the connection terminal 114 and is connected to the accommodating portion 122 in the end portion on the side that is close to the connection terminal 114.

As illustrated in FIG. 37, the horizontal surface 128 is a part against which the cover member 140 attached to the main body portion 102 abuts.

Configuration of Cover Member 140

Next, the configuration of the cover member 140 will be described. The cover member 140 is a transparent member formed of plastic, acryl, glass, or the like.

Incidentally, the entire cover member 140 does not have to be constituted by a transparent member and only a lens portion 141 (described later) may be constituted by a transparent member.

As illustrated in FIGS. 31 to 33 and 37, the lens portion 141 is formed in an upper surface portion 142 of the cover member 140. As illustrated in FIG. 37, the lens portion 141 is disposed at a position facing the light-emitting element 130 in a state where the cover member 140 is attached to the main body portion 102.

Incidentally, the lens portion 141 may be formed integrally with the upper surface portion 142 or may be configured by a separate lens being fitted into a through hole formed in the upper surface portion 142.

A claw portion 144 protruding to the outside is formed on the outer surface side of the side surface portion 143 of the cover member 140. The claw portion 144 is used for attachment to a vehicle interior member or the like.

As described above, the claw portion 145 protruding to the inside is formed on the inner surface side of the side surface portion 143 of the cover member 140. By the cover member 140 being pushed downward from above the mounting portion 121, the claw portion 145 is fitted with the claw locking portion 123 of the mounting portion 121. As a result, the cover member 140 is fixed to the mounting portion 121.

Incidentally, as illustrated in FIG. 33, the upper surface portion 142 of the cover member 140 and an upper surface portion 122A of the accommodating portion 122 are substantially on the same plane in a state where the cover member 140 is attached to the main body portion 102. In other words, the heights of the upper surface portion 122A of the cover member 140 and the upper surface portion 122A of the accommodating portion 122 substantially coincide with each other in side view.

Effect of Light-Emitting Device 101

In the light-emitting device 101 described above, the inclined surface 127 is formed in the connection portion 126 between the mounting portion 121 and the accommodating portion 122, and thus local stress concentration on the connection portion 126 can be suppressed. Accordingly, the strength of the connection portion 126 can be improved. As a result, it is possible to improve the strength of the holding member 120 holding the conductive member 111 to which the light-emitting element 130 is attached.

In the light-emitting device 101, the flat portion 121A, which is the upper surface of the mounting portion 121, is below the upper surface portion 122A of the accommodating portion 122.

As a result, the upper surface of the accommodating portion 122 abuts against an object from above before the upper surface of the mounting portion 121 abuts against the object, and thus the upper surface of the mounting portion 121 where the light-emitting element 130 is disposed can be protected.

In the light-emitting device 101, the cover member 140 is attached to the mounting portion 121 in a state of abutting against the horizontal surface 128 of the connection portion 126.

As a result, the attachment position of the cover member 140 is determined with ease and the cover member 140 is attached with ease. As a result, it is possible to suppress damage to the light-emitting element 130 disposed in the mounting portion 121 when the cover member 140 is attached.

In the light-emitting device 1, the cover member 140 is attached to the mounting portion 121 in a state of abutting against the horizontal surface 128 of the connection portion 126 and the flat portion 121A of the mounting portion 121.

As a result, the cover member 140 is supported at a plurality of points, and thus rattling of the cover member 140 can be suppressed.

Molding of the mounting portion 121 can be facilitated by the flat portion 121A being the upper surface of the mounting portion 121.

In the light-emitting device 101, the upper surface portion 122A of the accommodating portion 122 and the upper surface portion 142 of the cover member 140 are substantially on the same plane in a state where the cover member 140 is attached to the mounting portion 121.

As a result, it is possible to avoid providing a large step on the upper surface of the light-emitting device 101. As a result, the design of the light-emitting device 101 is improved.

In the light-emitting device 101, the cover member 140 has the lens portion 141 facing the light-emitting element 130.

As a result, the light-emitting device 101 can be reduced in size as compared with a case where the cover member 140 and the lens portion 141 are separately configured.

In the light-emitting device 101, the inclined portion 115 of the conductive member 111 is inserted into the connection portion 126 and the inclined portion 115 and the inclined surface 127 of the connection portion 126 are uniform in direction of inclination.

As a result, it is possible to protect the inclined portion 115 of the conductive member 111 by means of the connection portion 126 and make the inclined portion 115 of the conductive member 111 unlikely to break. In addition, the strength of the connection portion 126 of the holding member 120 can be improved by the inclined portion 115 of the conductive member 111 being inserted in the connection portion 126.

Other Embodiments

The present invention is not limited to the above embodiments.

For example, the light-emitting device 101 may be provided with a plurality of the light-emitting elements 130. In addition, the light-emitting element 130 is not limited to an LED and a fluorescent light, a semiconductor laser, and so on may be used as the light-emitting element 130.

REFERENCE SIGNS LIST

1: LIGHT-EMITTING DEVICE
  1A: LIGHT-EMITTING DEVICE
  1B: LIGHT-EMITTING DEVICE
2: SUBSTRATE PORTION
3: MAIN BODY PORTION
  3A: MAIN BODY PORTION
10: CONDUCTIVE MEMBER LOT
11: CONDUCTIVE MEMBER
  11B: CONDUCTIVE MEMBER
12: CIRCUIT PORTION
13: ELECTRODE PAD
14: CONNECTION TERMINAL
15: CONNECTING PORTION
16: EXPOSED PORTION
17: VERTICALLY EXTENDING PORTION
18: SUPPORT MEMBER
19: HOLE
20: HOLDING MEMBER
  20A: HOLDING MEMBER
  20B: HOLDING MEMBER
21: MOUNTING PORTION
  21A: UPPER SURFACE PORTION
  21B: SIDE SURFACE PORTION
22: ACCOMMODATING PORTION
23: CLAW PORTION
24: CUTTING POINT
25: SLIDE GROOVE
30: LIGHT-EMITTING ELEMENT
35: RESISTANCE ELEMENT
40: COVER MEMBER
  40A: COVER MEMBER
  40B: COVER MEMBER
41: LENS PORTION
42: UPPER SURFACE PORTION
43: SIDE SURFACE PORTION
44: RECESS
45: FIRST OPENING PORTION
46: PROJECTING PORTION
47: SECOND OPENING PORTION
48A: FIRST ABUTTING PORTION
48B: SECOND ABUTTING PORTION
50: BLOCKING MEMBER
51: HEAT SINK PORTION
101: LIGHT-EMITTING DEVICE
102: MAIN BODY PORTION
111: CONDUCTIVE MEMBER
112: CIRCUIT PORTION
113: ELECTRODE PAD
114: CONNECTION TERMINAL
115: INCLINED PORTION
120: HOLDING MEMBER
121: MOUNTING PORTION
  121A: FLAT PORTION
122: ACCOMMODATING PORTION
  122A: UPPER SURFACE PORTION
123: CLAW LOCKING PORTION
126: CONNECTION PORTION
127: INCLINED SURFACE
128: HORIZONTAL SURFACE
130: LIGHT-EMITTING ELEMENT
135: RESISTANCE ELEMENT
140: COVER MEMBER
141: LENS PORTION
142: UPPER SURFACE PORTION
143: SIDE SURFACE PORTION
144: CLAW PORTION
145: CLAW PORTION
150: VIRTUAL CUTTING PORTION

The invention claimed is:

1. A light-emitting device comprising:
a conductive member configuring an electric circuit;
a holding member holding the conductive member by inserting at least a part of the conductive member in the holding member;
a light-emitting element attached to the conductive member; and
a cover member covering the holding member, wherein the conductive member comprises:
a circuit portion that is inserted in the holding member;
an electrode pad that is connected to the circuit portion and attached to the light-emitting element; and
a connection terminal for connecting the conductive member to an external circuit,
the circuit portion connects the electrode pad to the connection terminal,
the holding member comprises:
a mounting portion holding the circuit portion; and
an accommodating portion in which the connection terminal extending from the mounting portion is accommodated,
the circuit portion in the conductive member has exposed portions that are exposed outward from the mounting portion of the holding member and not designed to be electrically connected to the external circuit, and
the cover member covers the mounting portion and the exposed portions.

2. The light-emitting device according to claim 1, wherein the cover member has a lens portion disposed at a position facing the light-emitting element.

3. The light-emitting device according to claim 2, wherein the cover member has:
an upper surface portion where the lens portion is formed; and
a side surface portion where a second engagement portion is formed, the second engagement portion being engaged with a first engagement portion provided in a side portion of the holding member, and
the second engagement portion is formed at a position not overlapping the lens portion in top view.

4. The light-emitting device according to claim 3, wherein the first engagement portion is formed at a position not overlapping the exposed portion in top view.

5. The light-emitting device according to claim 1, wherein an upper surface portion of the cover member and an upper surface portion of the holding member are substantially on the same plane in side view.

6. The light-emitting device according to claim 1, wherein the cover member is engaged with the holding member by sliding.

7. The light-emitting device according to claim 1, wherein the conductive member is provided with:
a first connection portion connected to the light-emitting element; and
a second connection portion connected to an electric power source,
the mounting portion holds the first connection portion; and
the accommodating portion accommodates the second connection portion, and
the mounting portion and the accommodating portion are provided at positions not vertically overlapping each other.

8. The light-emitting device according to claim 7, wherein
an upper surface of the mounting portion and an upper surface of the accommodating portion are substantially on the same plane, and
the conductive member is bent such that the first connection portion is above the second connection portion in side view.

9. The light-emitting device according to claim 7, wherein
a hole is vertically formed in a lower surface of the mounting portion, and
a distance between the conductive member and a lower surface of the mounting portion exceeds a distance between the conductive member and an upper surface of the mounting portion.

10. The light-emitting device according to claim 7, wherein
a hole is vertically formed in a lower surface of the mounting portion, and
the hole is blocked by a blocking member.

11. The light-emitting device according to claim 7, wherein the mounting portion has a heat sink portion.

12. The light-emitting device according to claim 7, wherein
the conductive member has a vertically extending portion extending in a vertical direction; and
the circuit portion connects one end of the vertically extending portion and the first connection portion, and
the second connection portion is connected to the other end of the vertically extending portion.

13. A manufacturing method of a light-emitting device comprising:
preparing a conductive member configuring an electric circuit, a holding member, a light-emitting element, and a cover member;
holding the conductive member in the holding member by inserting at least a part of the conductive member in the holding member,
attaching the light-emitting element to the conductive member, and
covering the holding member with the cover member, wherein
the conductive member comprises:
a circuit portion that is inserted in the holding member;
an electrode pad that is connected to the circuit portion and attached to the light-emitting element; and
a connection terminal for connecting the conductive member to an external circuit,
the circuit portion connects the electrode pad to the connection terminal,
the holding member comprises:
a mounting portion holding the circuit portion; and
an accommodating portion in which the connection terminal extending from the mounting portion is accommodated,
the circuit portion in the conductive member has exposed portions that are exposed outward from the mounting portion of the holding member and not designed to be electrically connected to the external circuit, and
the cover member covers the mounting portion and the exposed portions.

* * * * *